US00RE40601E

(19) United States
(12) Reissued Patent
Inoue et al.

(10) Patent Number: US RE40,601 E
(45) Date of Reissued Patent: Dec. 9, 2008

(54) MANUFACTURING METHOD OF ACTIVE MATRIX SUBSTRATE, ACTIVE MATRIX SUBSTRATE AND LIQUID CRYSTAL DISPLAY DEVICE

(75) Inventors: Satoshi Inoue, Chino (JP); Tatsuya Shimoda, Suwa-gun (JP)

(73) Assignee: Seiko Epson Corporation, Tokyo (JP)

(21) Appl. No.: 10/748,206

(22) Filed: Dec. 31, 2003

Related U.S. Patent Documents

Reissue of:
(64) Patent No.: 6,127,199
Issued: Oct. 3, 2000
Appl. No.: 09/113,373
Filed: Jul. 10, 1998

U.S. Applications:
(60) Division of application No. 10/263,070, filed on Oct. 3, 2002, now Pat. No. Re. 38,466, which is a continuation-in-part of application No. PCT/JP97/04110, filed on Nov. 11, 1997.

(30) Foreign Application Priority Data

Nov. 12, 1996 (JP) ..... 8-315590
Nov. 22, 1996 (JP) ..... 8-327688

(51) Int. Cl.
*H01L 21/00* (2006.01)

(52) U.S. Cl. ..... 257/59; 438/30
(58) Field of Classification Search ..... 438/30, 438/151–166; 257/59
See application file for complete search history.

(56) References Cited

U.S. PATENT DOCUMENTS 4,654,117 A * 3/1987 Aoki et al. ..... 438/160
5,008,218 A 4/1991 Kawachi et al.
5,110,748 A * 5/1992 Sarma ..... 438/30
5,468,521 A 11/1995 Kanai et al.
5,527,649 A 6/1996 Sato et al.
5,589,962 A 12/1996 Yamamoto et al.
5,693,541 A 12/1997 Yamazaki et al.
5,747,121 A 5/1998 Okazaki et al.
5,767,930 A 6/1998 Kobayashi et al.
5,807,772 A 9/1998 Takemura
5,811,348 A 9/1998 Matsushita et al.
5,888,839 A 3/1999 Ino et al.
5,926,735 A 7/1999 Yamazaki et al.
6,100,165 A 8/2000 Sakaguchi et al.

FOREIGN PATENT DOCUMENTS

JP A-61-231714 10/1986
JP 61-231714 10/1986
JP 63-101830 A 5/1988

(Continued)

OTHER PUBLICATIONS

Sameshima, T. "Laser Beam Application to Thin Film Transistors," *Applied Surface Science 96–98*, (1996), pp. 352–358, month unknown.
Sameshima T., Laser beam application to the thin film transistors, Applied Surface Science, Apr. 2, 1996 vol. 96–98 pp. 352–358.

*Primary Examiner*—Richard A. Booth
(74) *Attorney, Agent, or Firm*—Oliff & Berridge, PLC

(57) ABSTRACT

A method of manufacturing an active matrix substrate is provided that uses a technique of transferring a thin film device. In forming thin film transistors and pixel electrodes on an original substrate before transfer, an insulator film such as an interlayer insulation film or the like, is previously removed before the pixel electrodes are formed. Further, the original substrate is separated by exfoliation to transfer the device to a transfer material to cause the pixel electrodes to partially appear in the surface or the vicinity of the surface of the device. This portion permits application of a voltage to a liquid crystal through the pixel electrode.

8 Claims, 27 Drawing Sheets

FOREIGN PATENT DOCUMENTS

| | | | |
|---|---|---|---|
| JP | A-63-101832 | | 5/1988 |
| JP | 63-1018832 | A | 5/1988 |
| JP | 04-170520 | A | 6/1992 |
| JP | A-04-178633 | | 6/1992 |
| JP | 05-218365 | A | 8/1993 |
| JP | A-05-267563 | | 10/1993 |
| JP | A-06-118441 | | 4/1994 |
| JP | A-06-504139 | | 5/1994 |
| JP | A-06-175157 | | 6/1994 |
| JP | 06-202160 | A | 7/1994 |
| JP | A-06-219052 | | 8/1994 |
| JP | A-6-291291 | | 10/1994 |
| JP | 6-291291 | | 10/1994 |
| JP | 07-098460 | A | 4/1995 |
| JP | A 07-504782 | | 5/1995 |
| JP | A 07-294961 | | 11/1995 |
| JP | A-07-302889 | | 11/1995 |
| JP | A-8-62591 | | 3/1996 |
| JP | 8-62591 | | 3/1996 |
| JP | A-08-213645 | | 8/1996 |
| JP | 08-234796 | A | 9/1996 |
| JP | 08-240814 | A | 9/1996 |
| JP | 08-250745 | A | 9/1996 |
| JP | 08-262474 | A | 10/1996 |
| JP | 08-262475 | A | 10/1996 |
| JP | 08-278519 | A | 10/1996 |
| JP | A-8-288522 | | 11/1996 |
| JP | 8-288522 | | 11/1996 |
| WO | WO 92/12453 | | 7/1992 |
| WO | WO 93/16491 | | 8/1993 |
| WO | 98/09333 | | 3/1998 |
| WO | WO 98/09333 | | 3/1998 |

* cited by examiner

[FIG. 1]
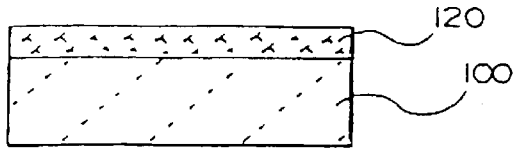
[FIG. 2]
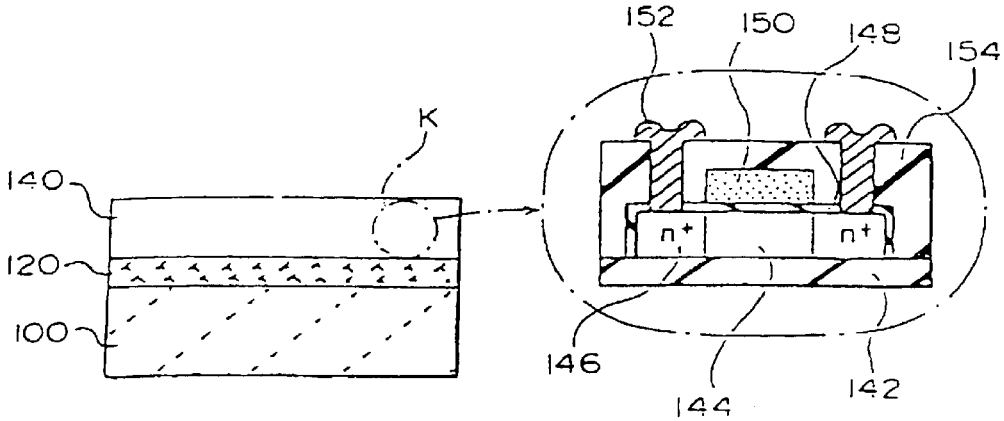
[FIG. 3]
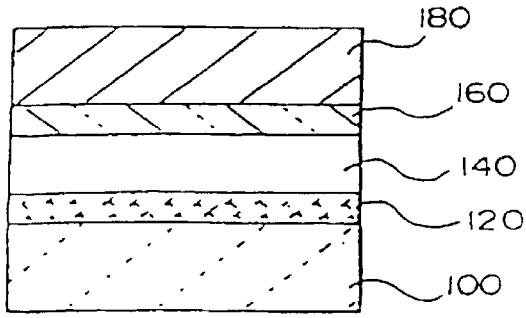

[FIG. 4]
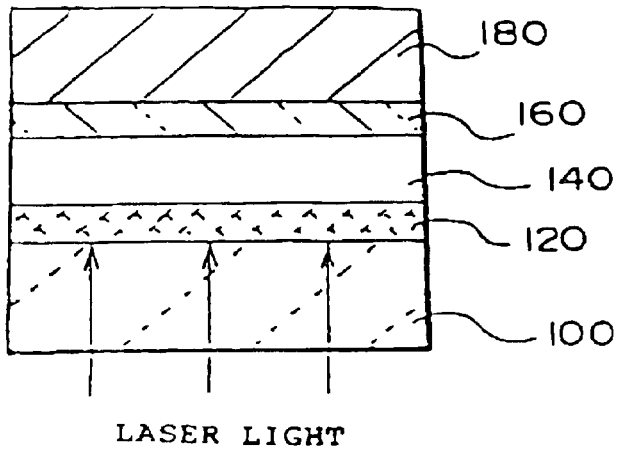
[FIG. 5]
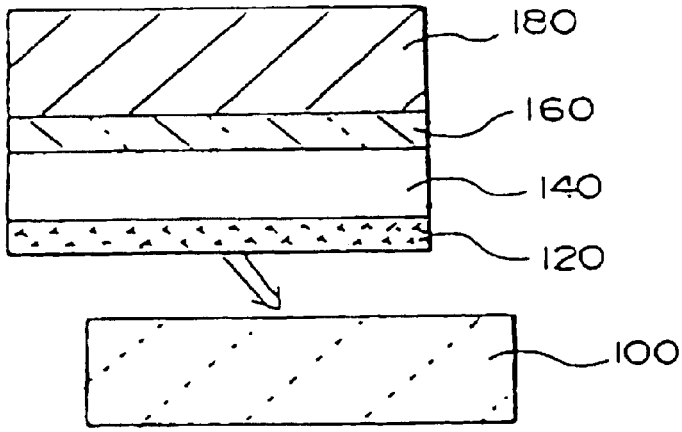
[FIG. 6]
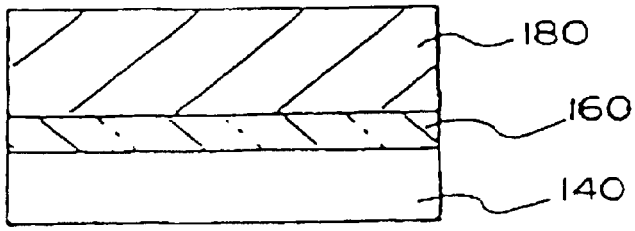

[FIG. 7]
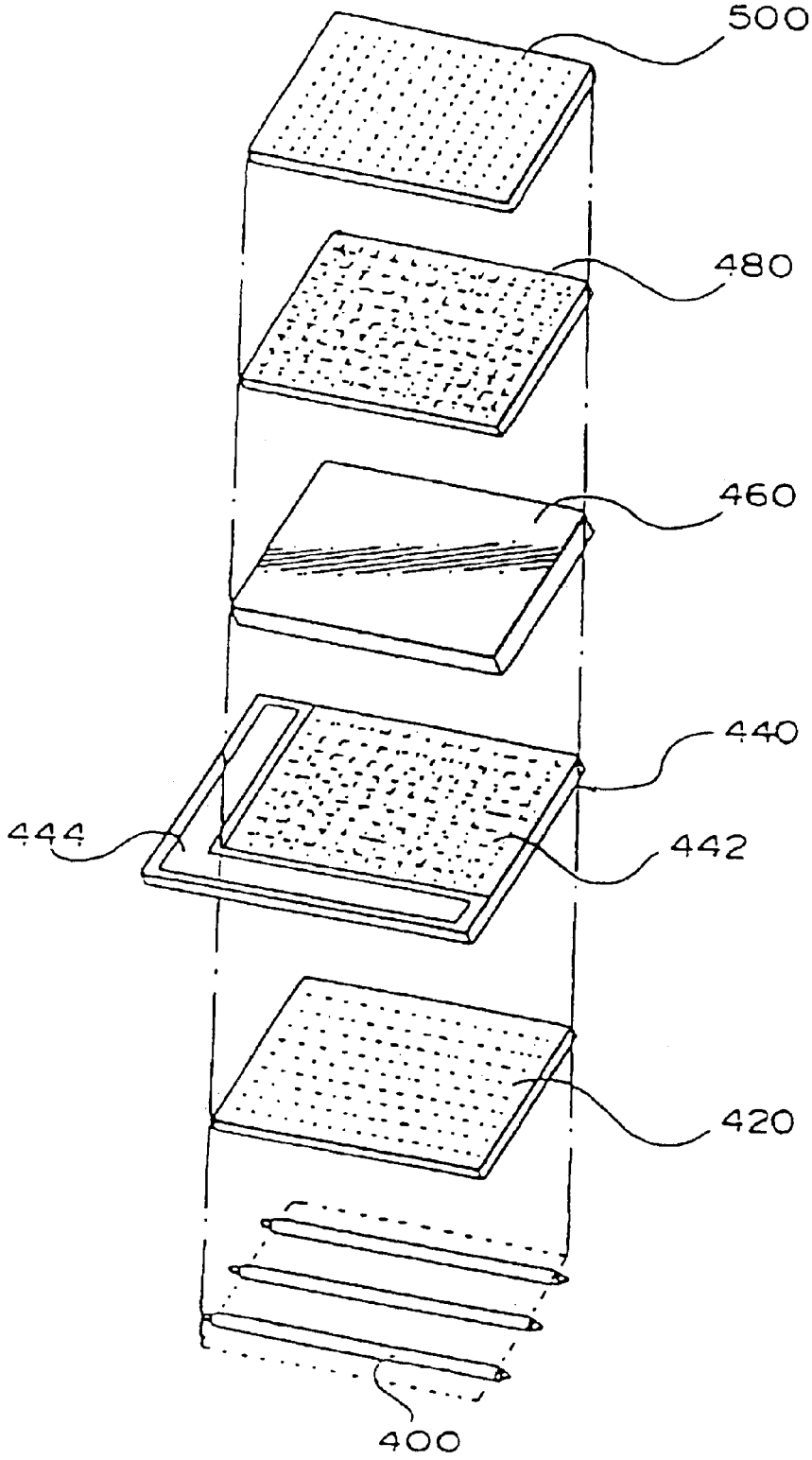

[FIG. 8]
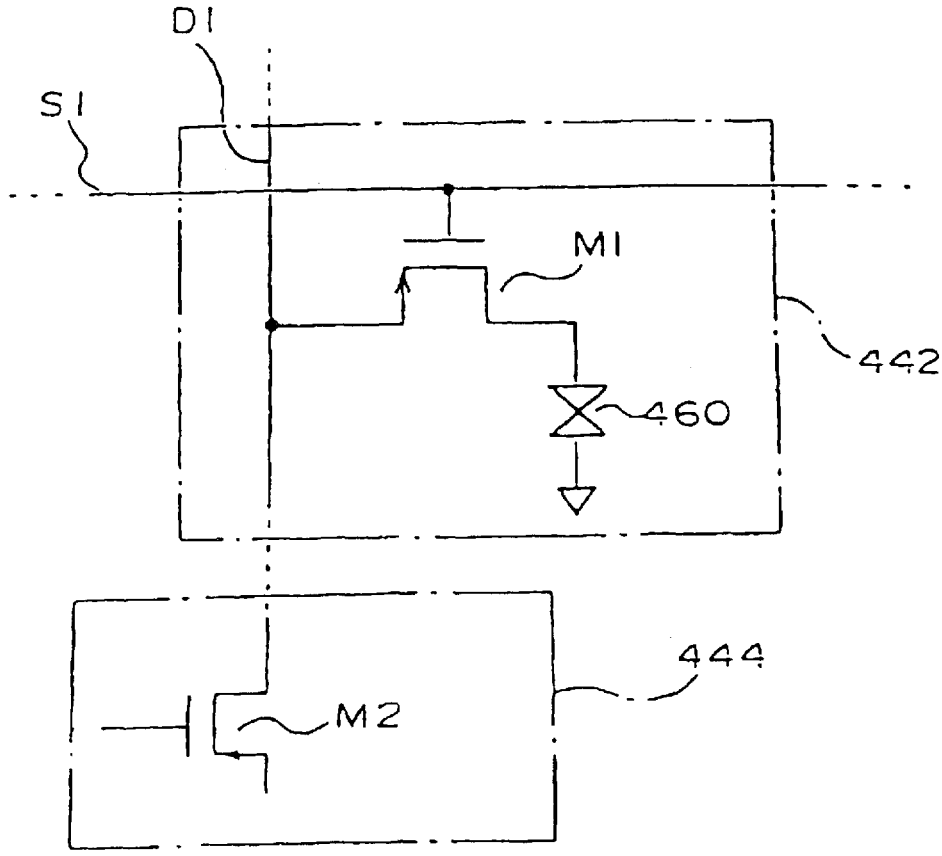

[FIG. 9]
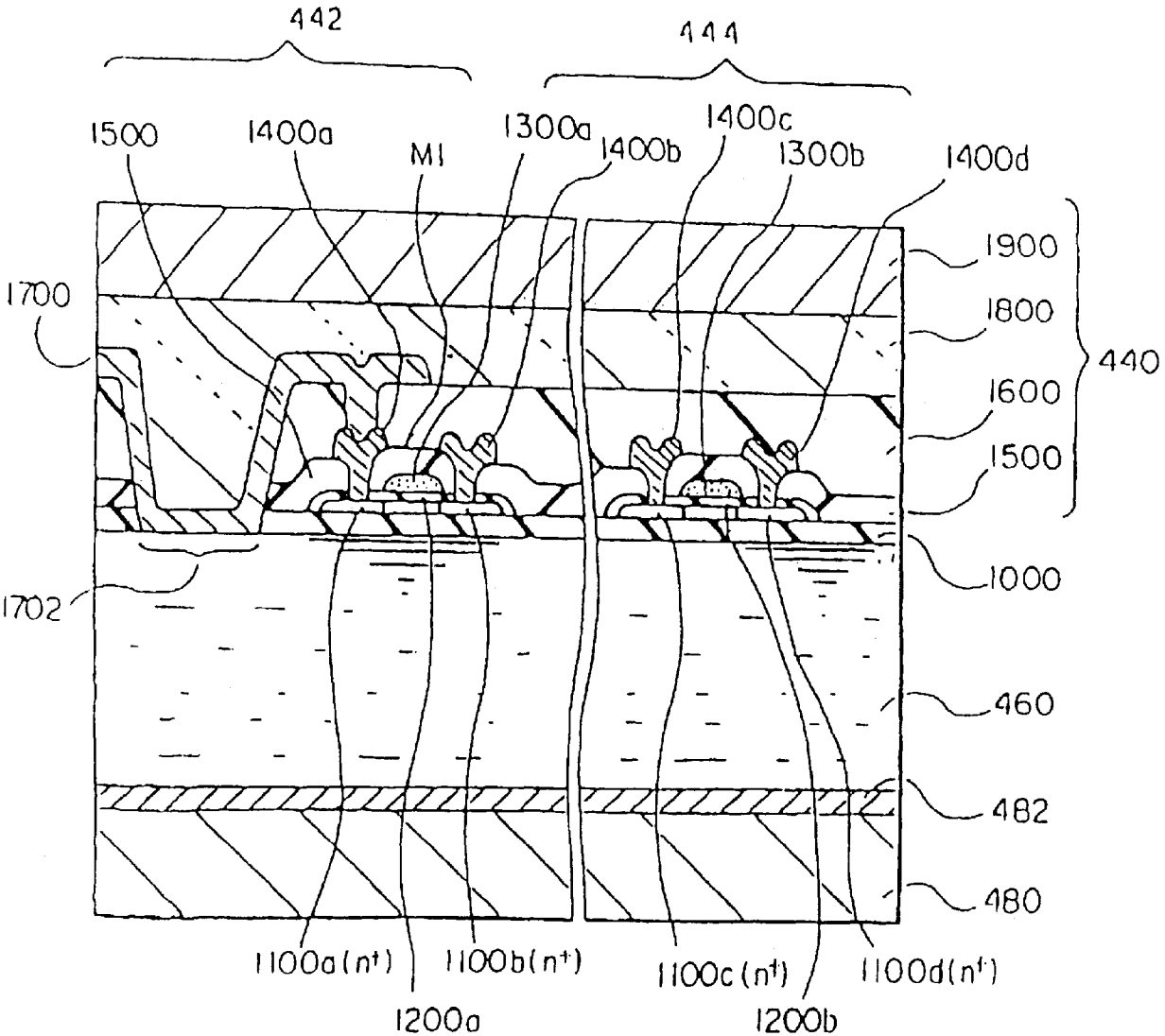

[FIG. 10]
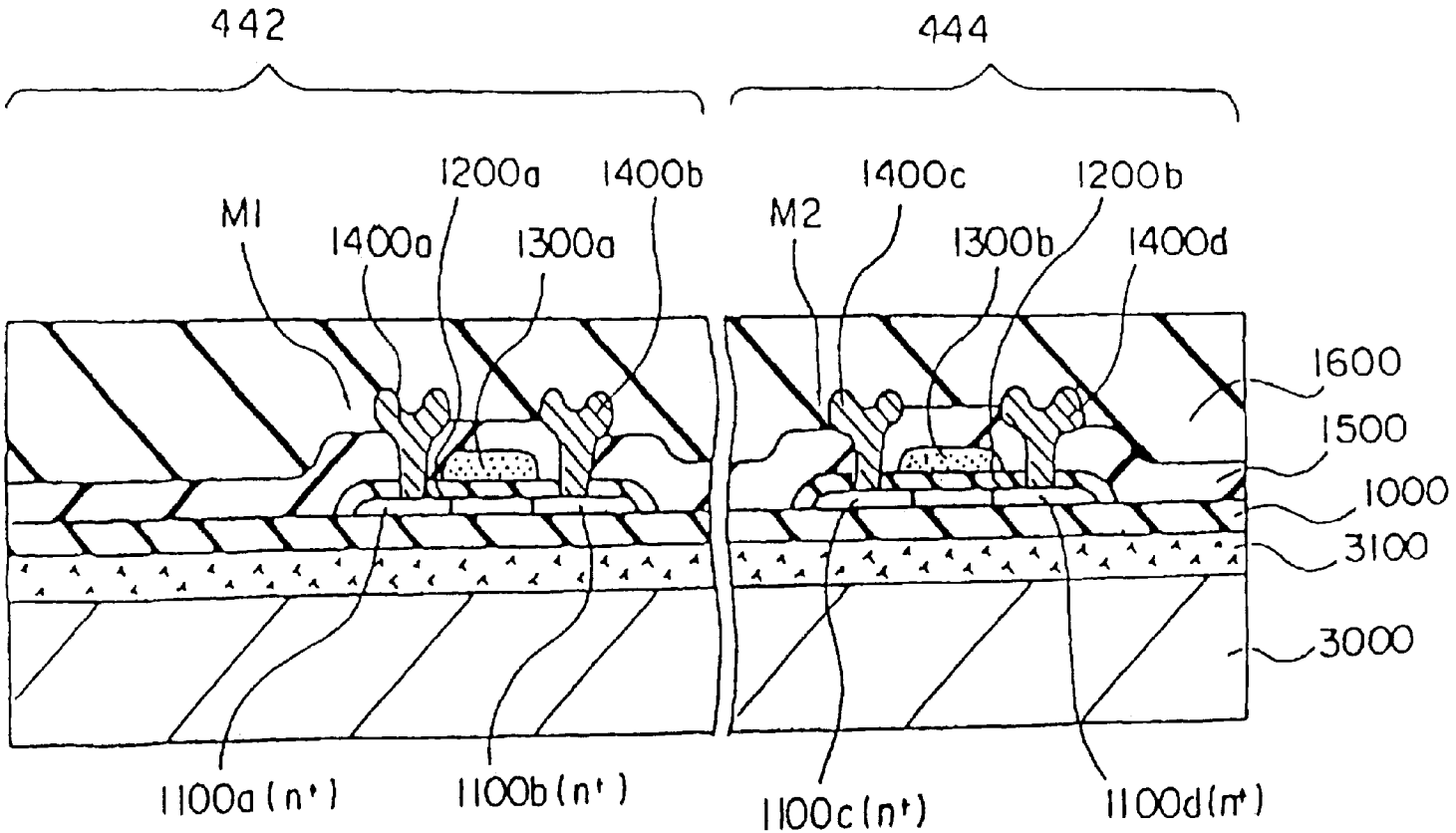

[FIG. 11]
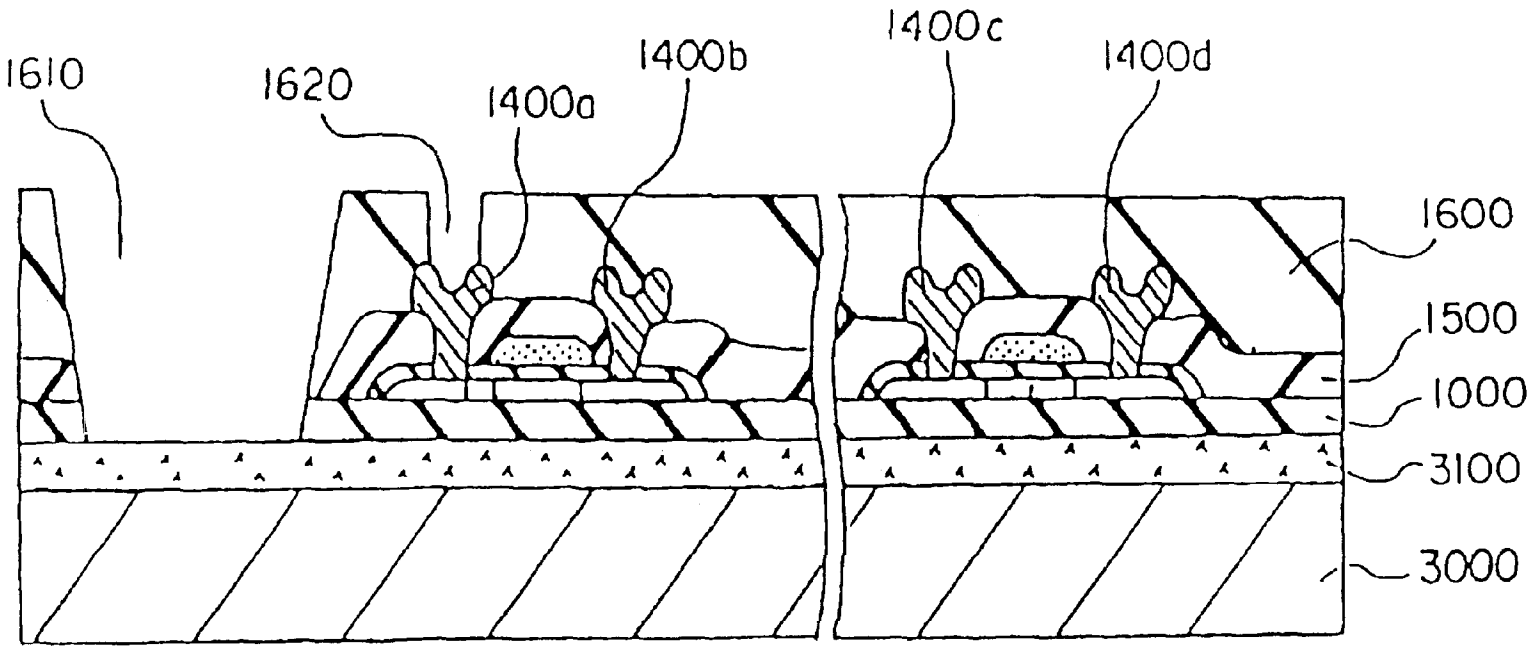

[FIG. 12]
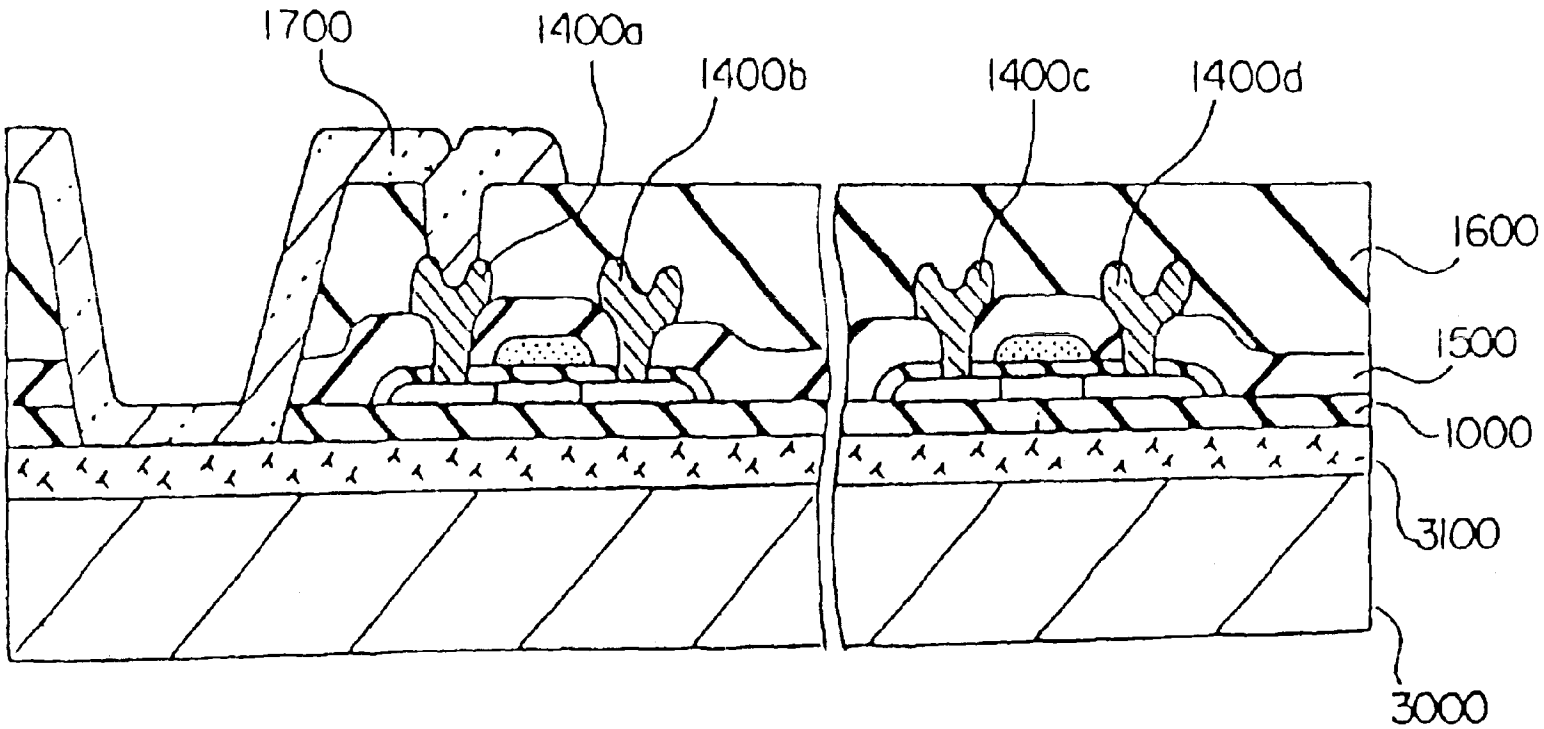

[FIG. 13]
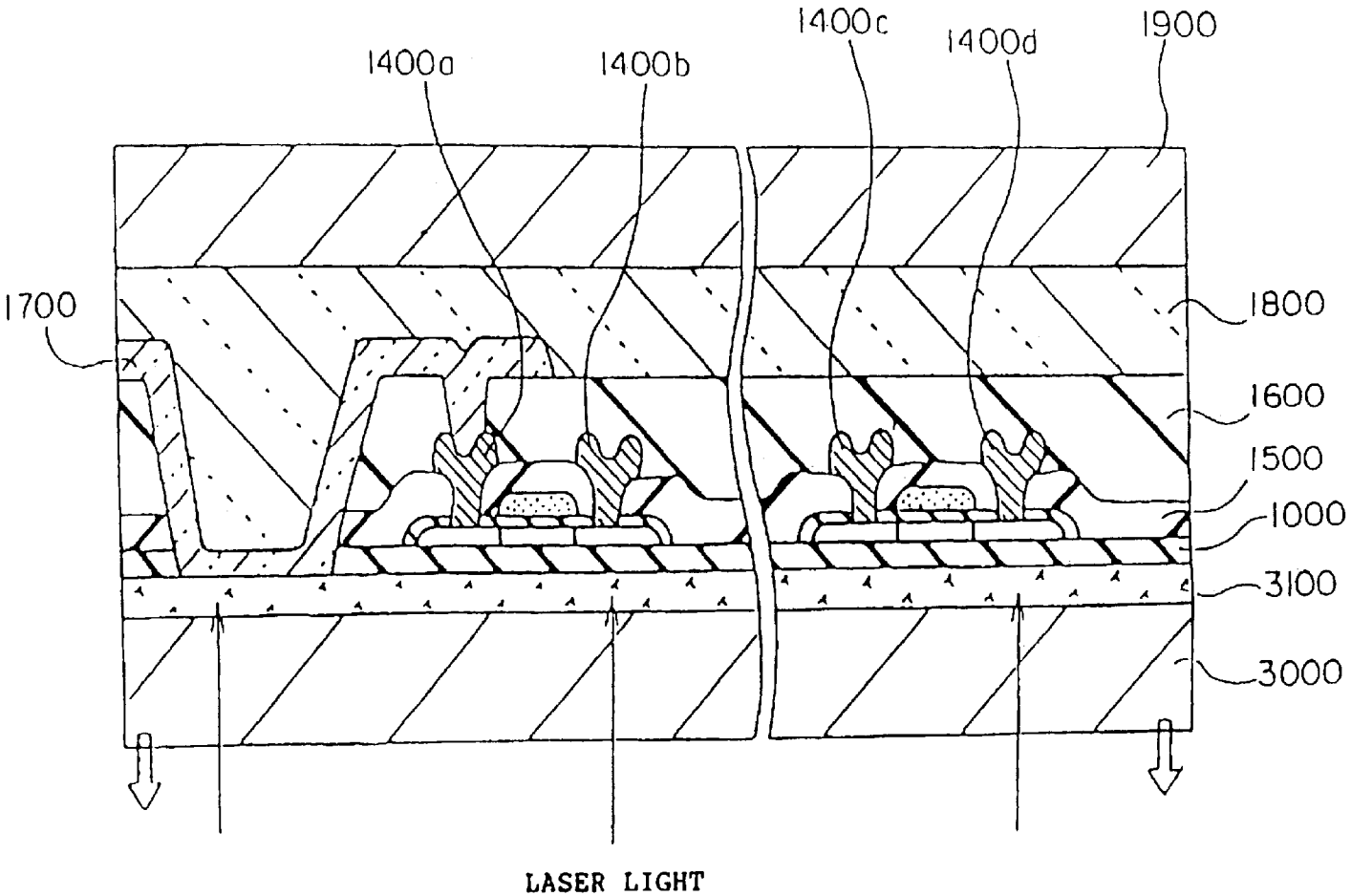

[FIG. 14]
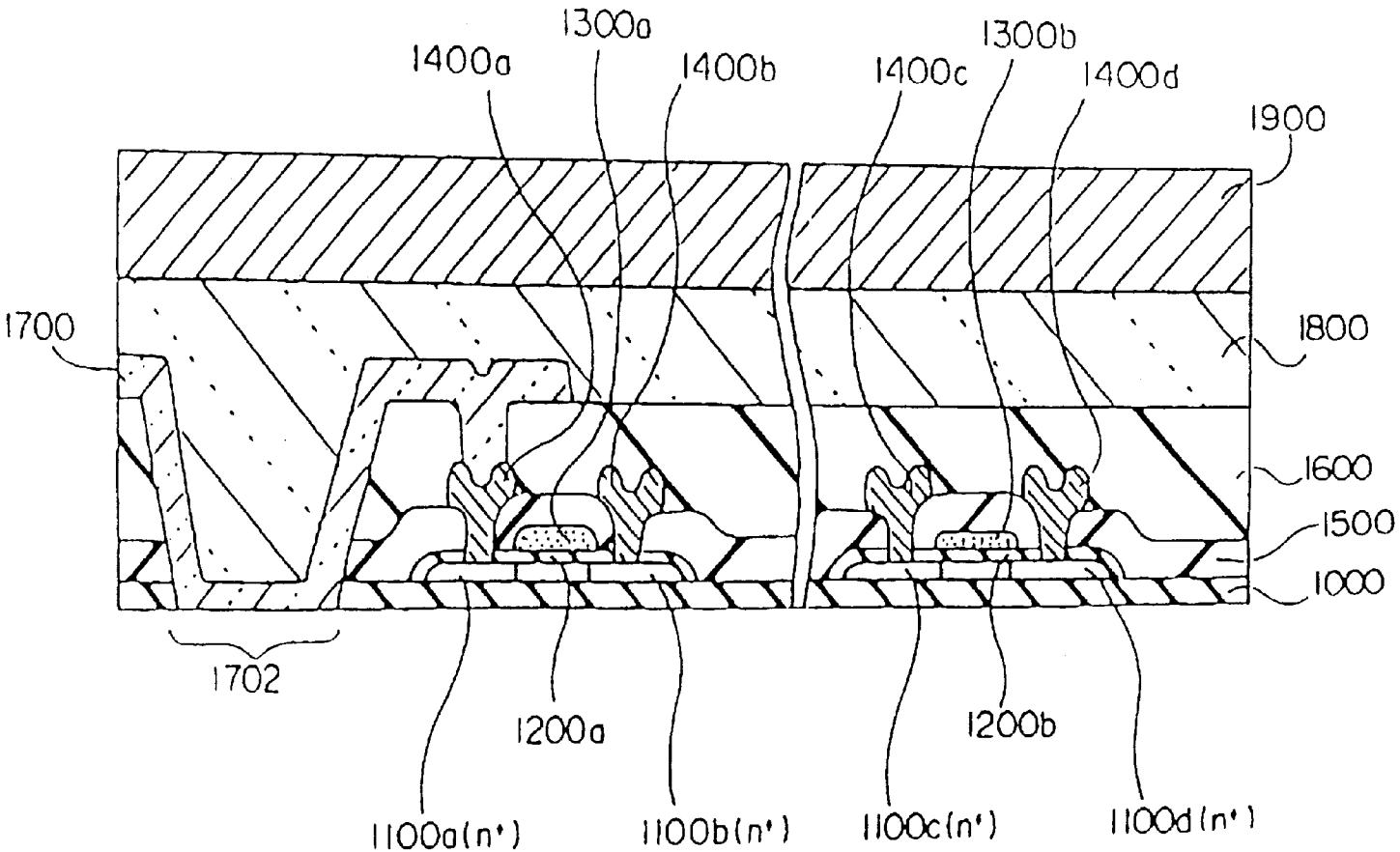

[FIG. 15]
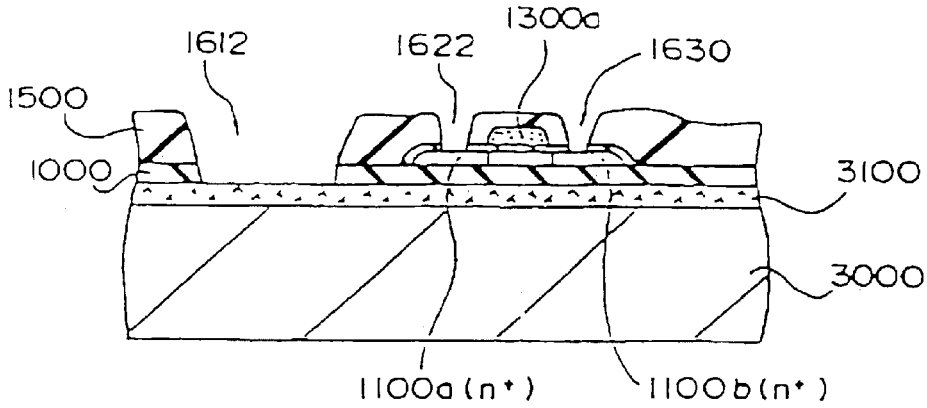
[FIG. 16]
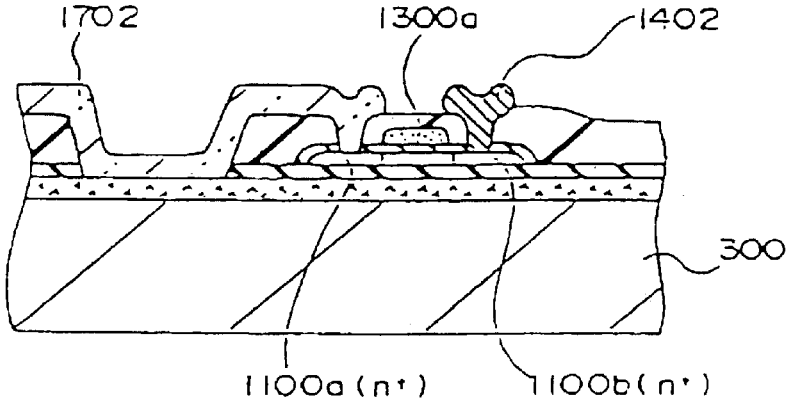
[FIG. 17]
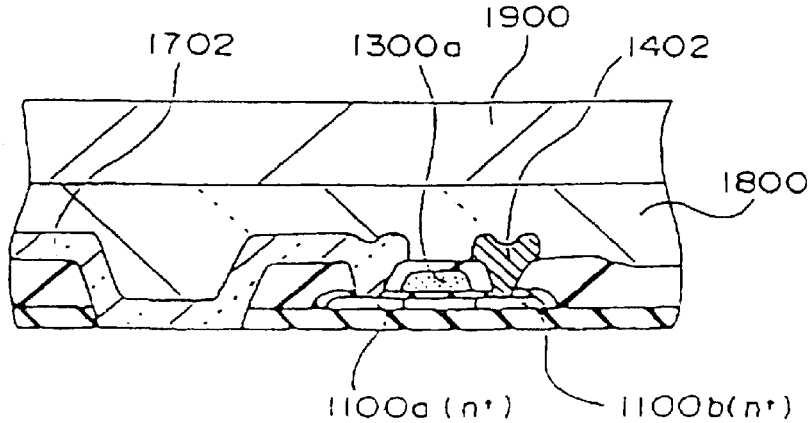

[FIG. 18]
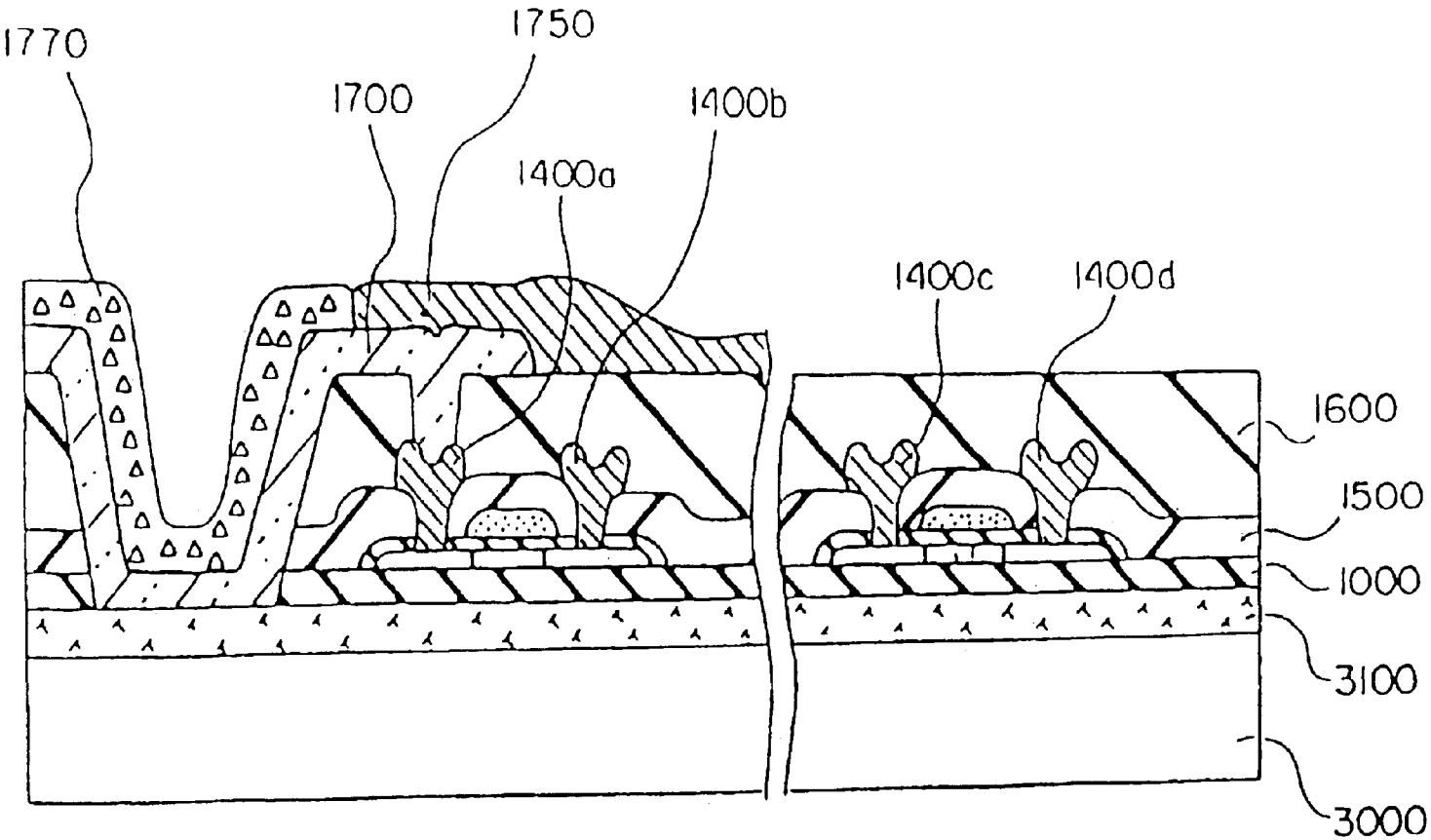

[FIG. 19]
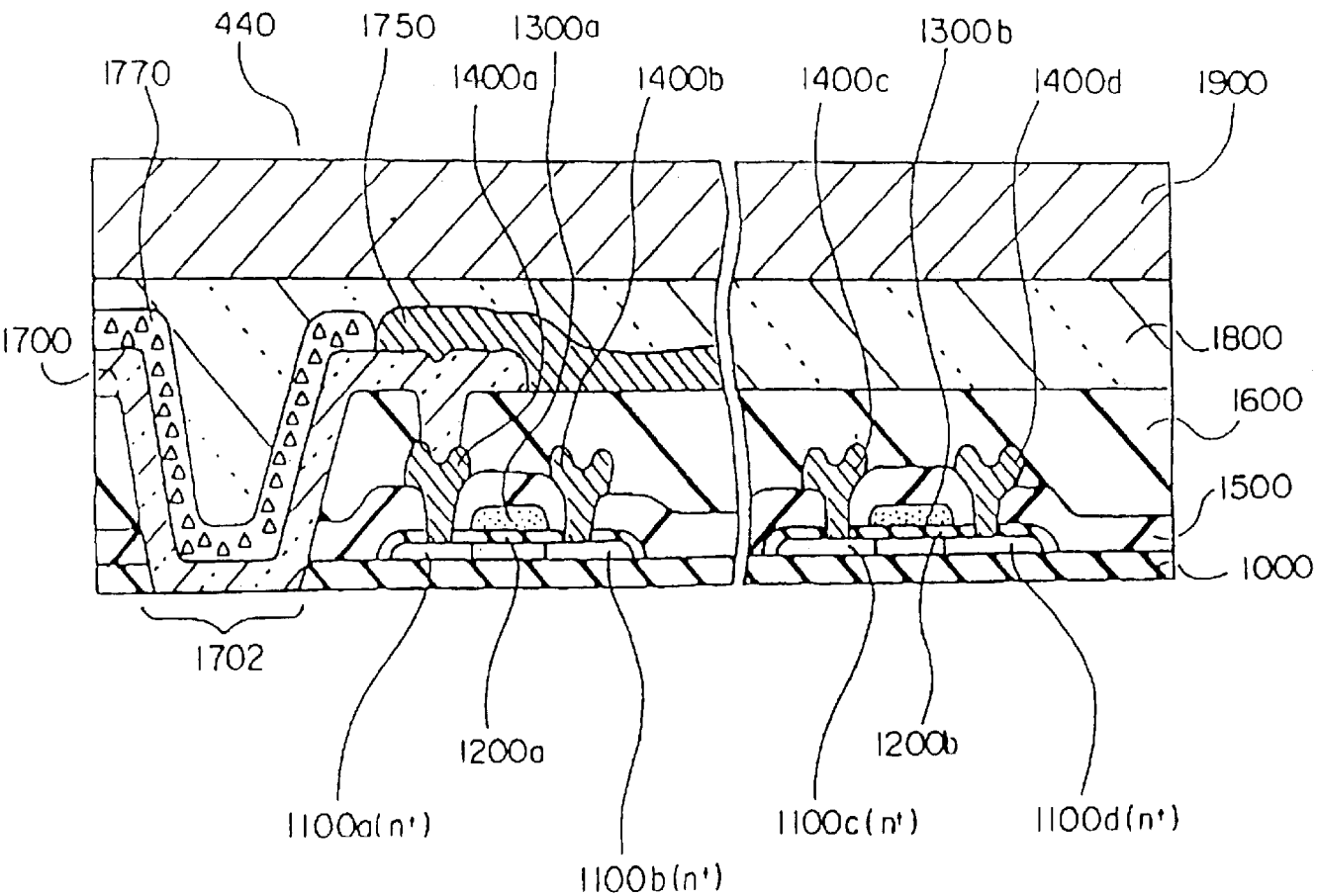

[FIG. 20]
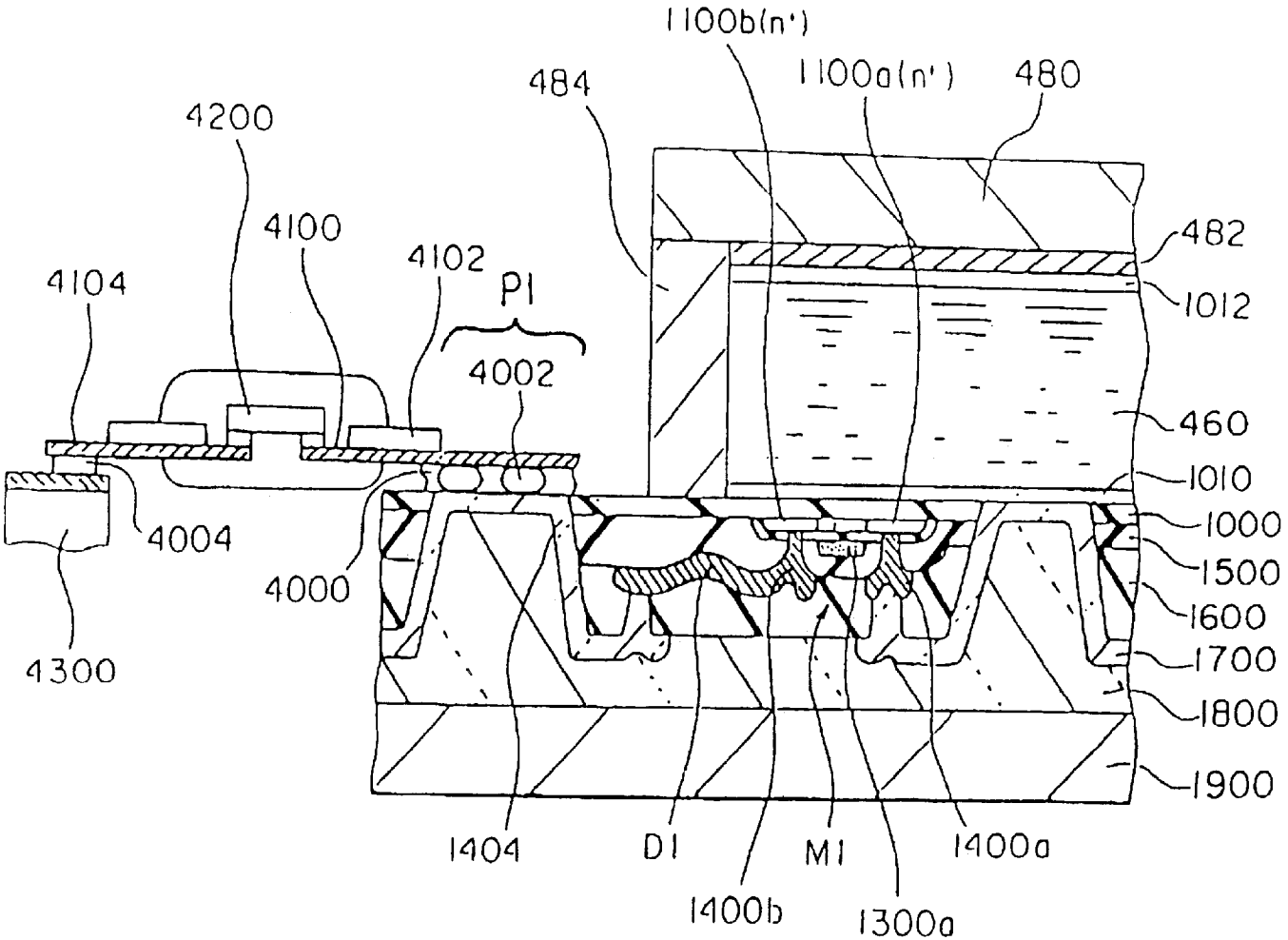

[FIG. 21]
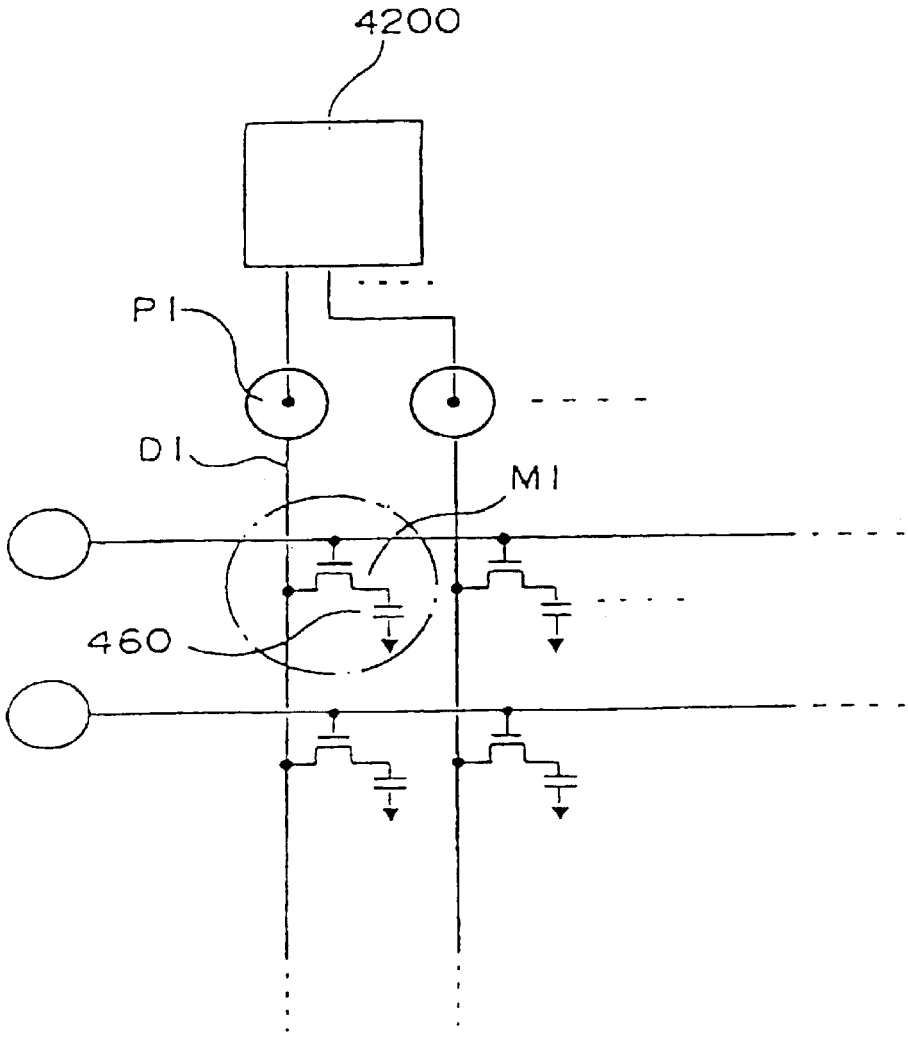

[FIG. 22]
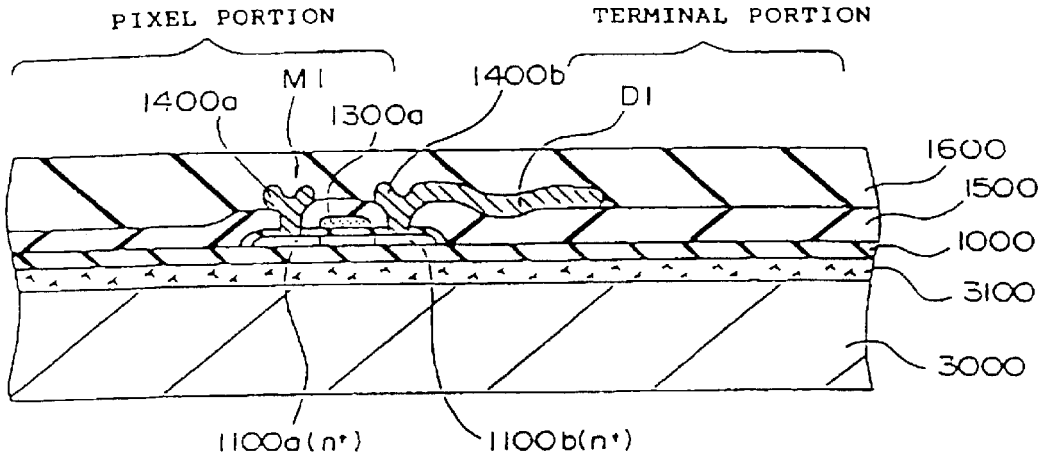
[FIG. 23]
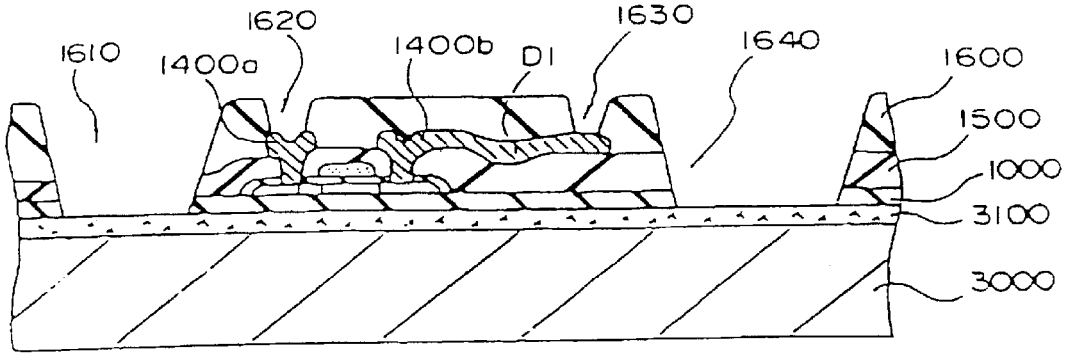

[FIG. 24]
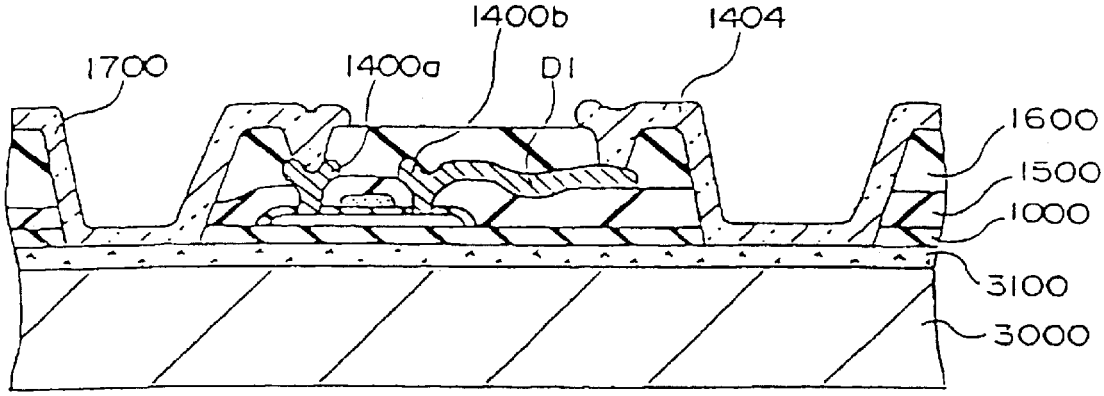
[FIG. 25]
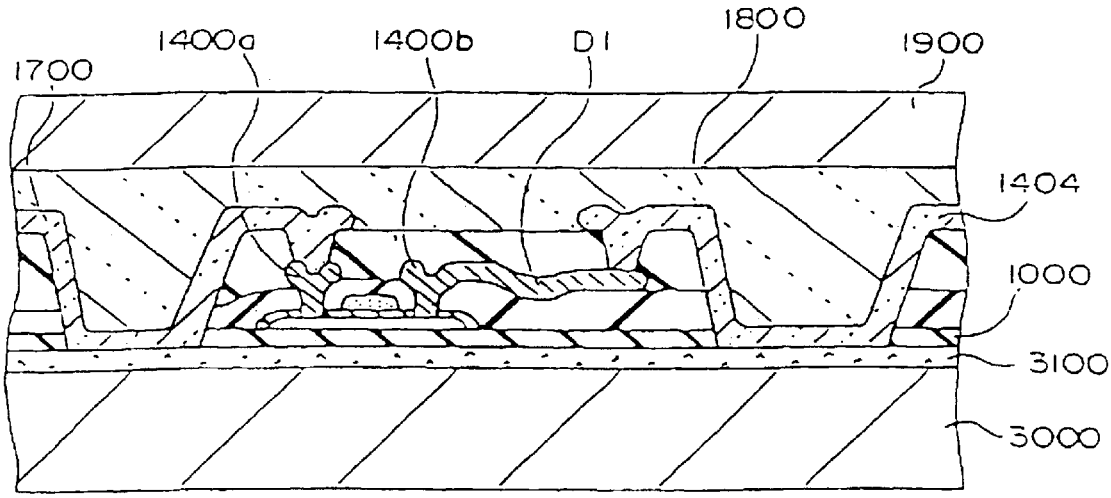

[FIG. 26]
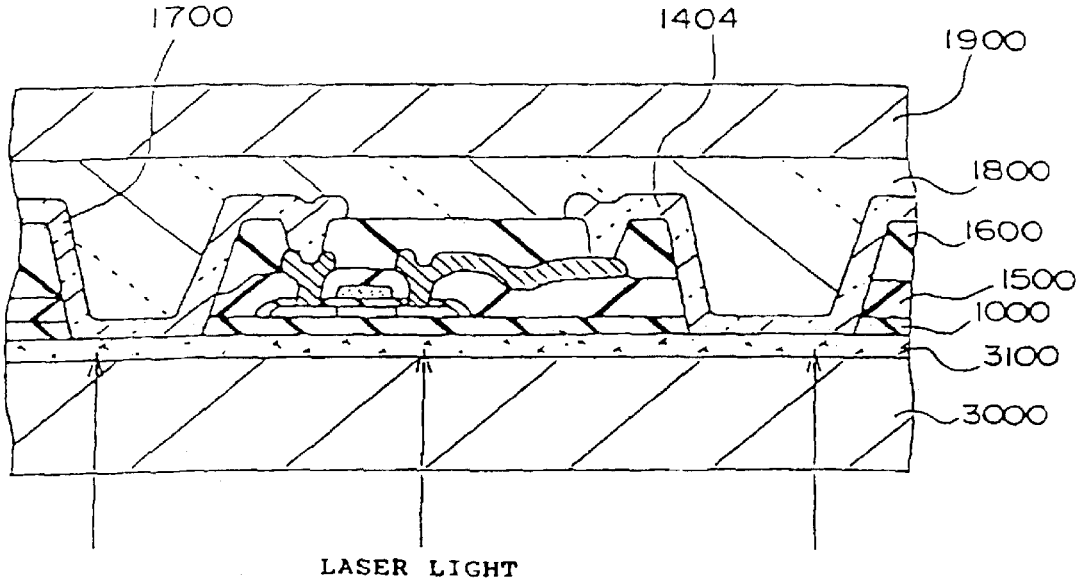
[FIG. 27]
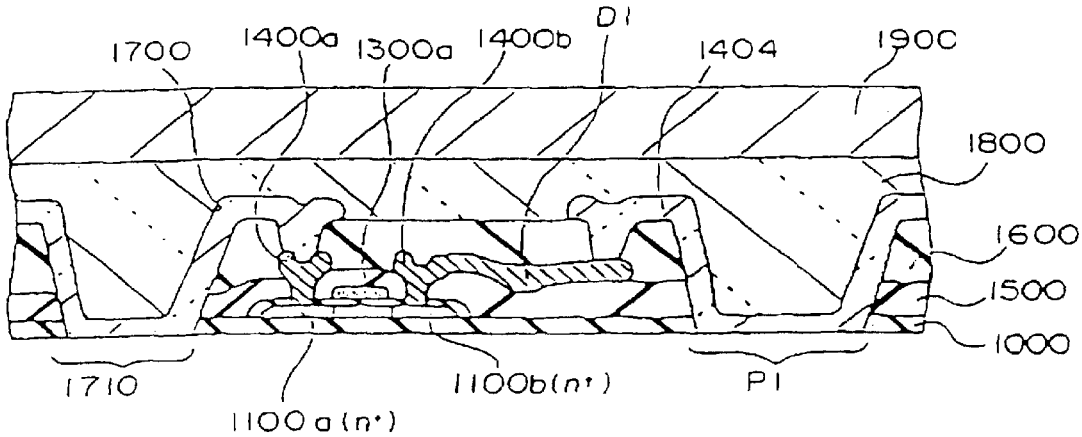

[FIG. 28]
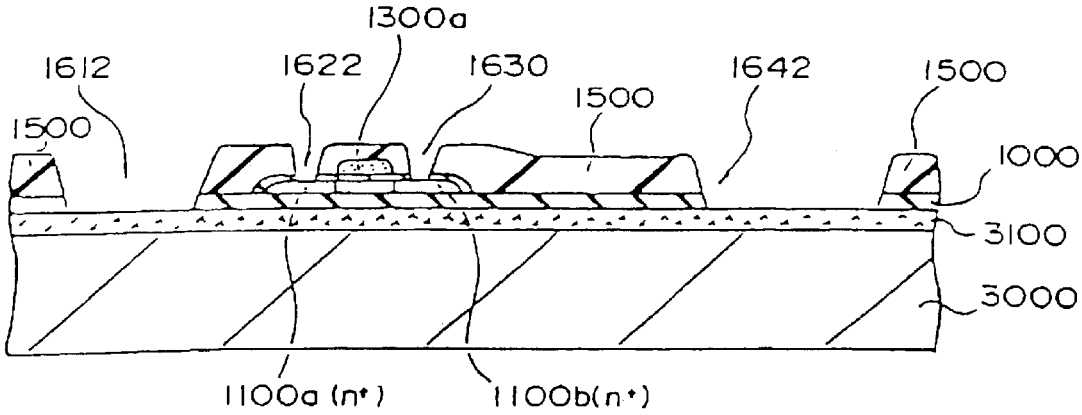
[FIG. 29]
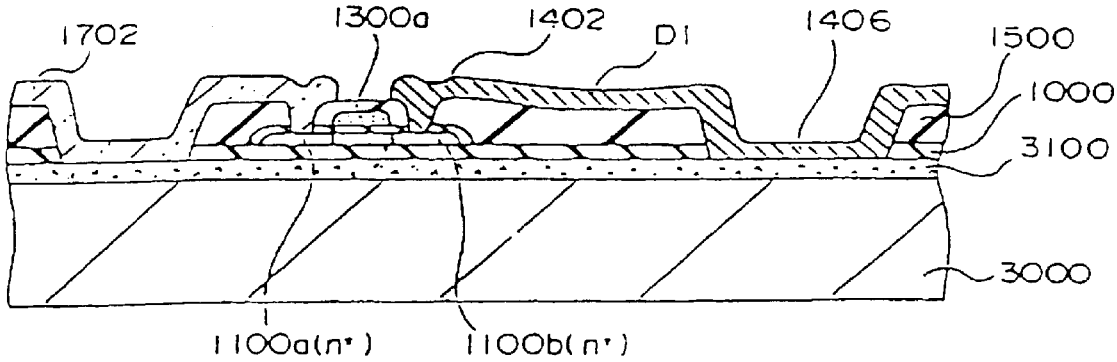

[FIG. 30]
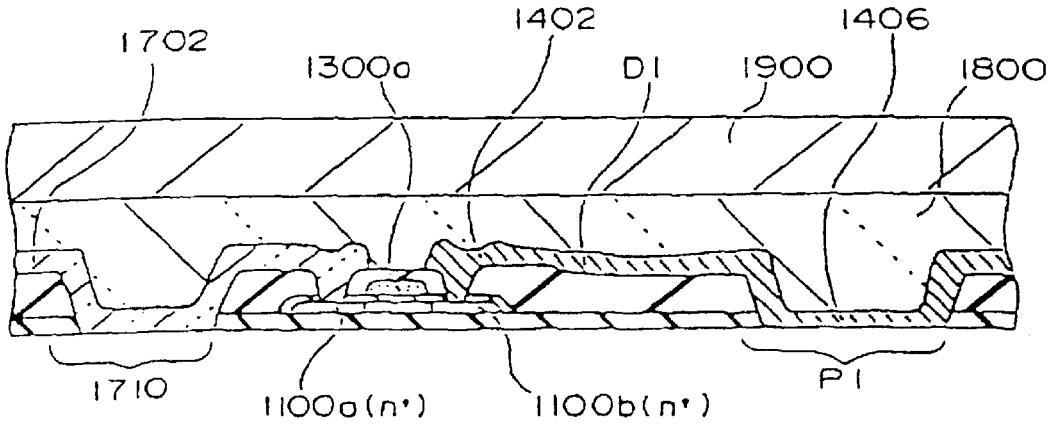

[FIG. 31]
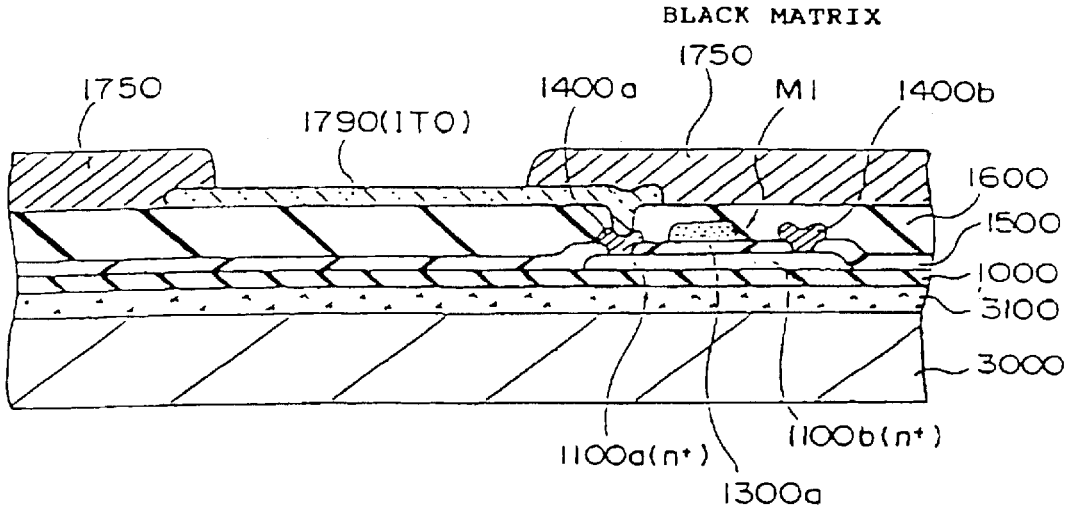
[FIG. 32]
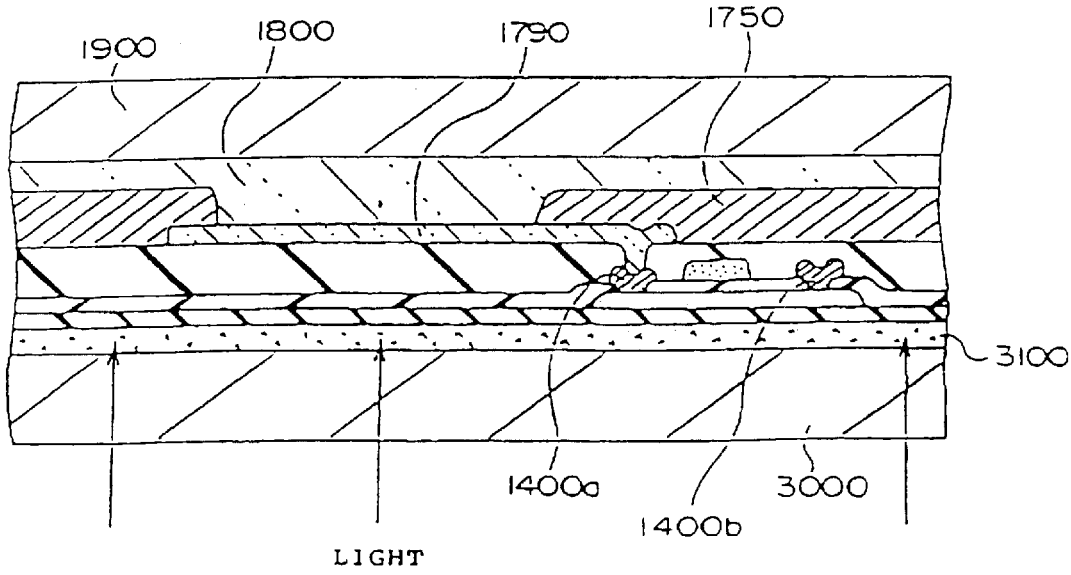

[FIG. 33]
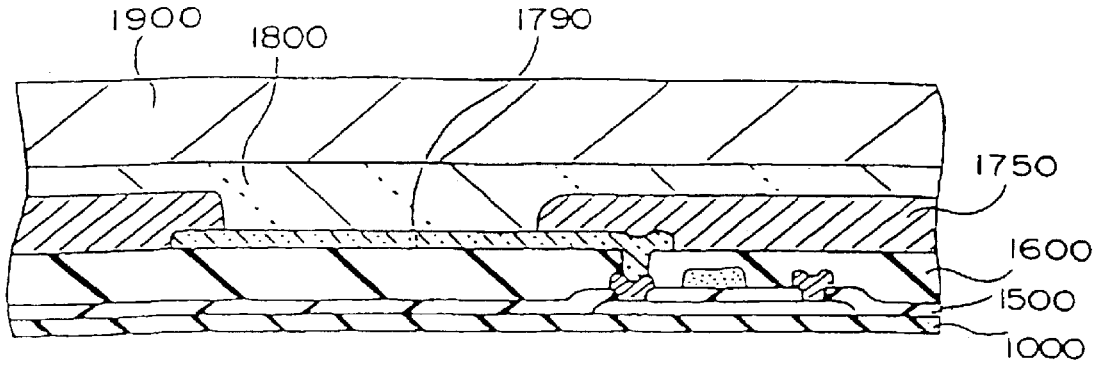
[FIG. 34]
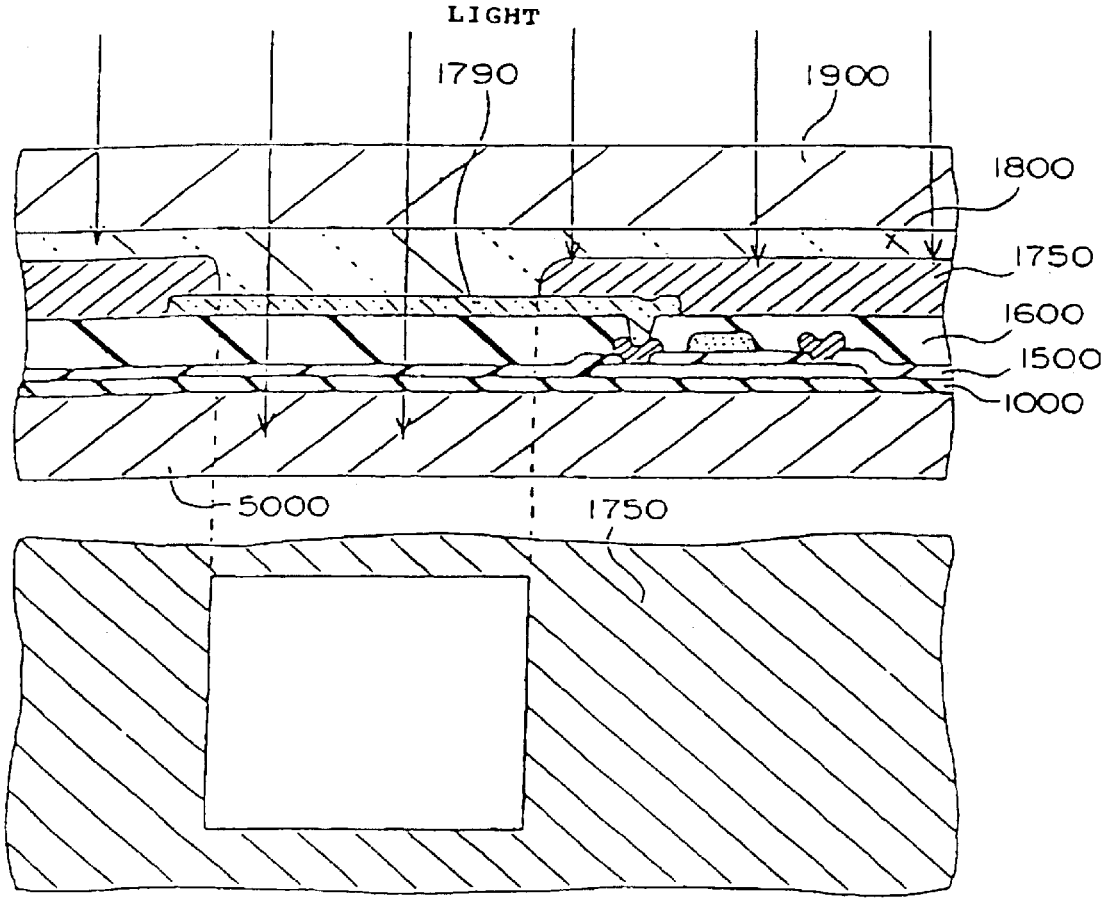

[FIG. 35]
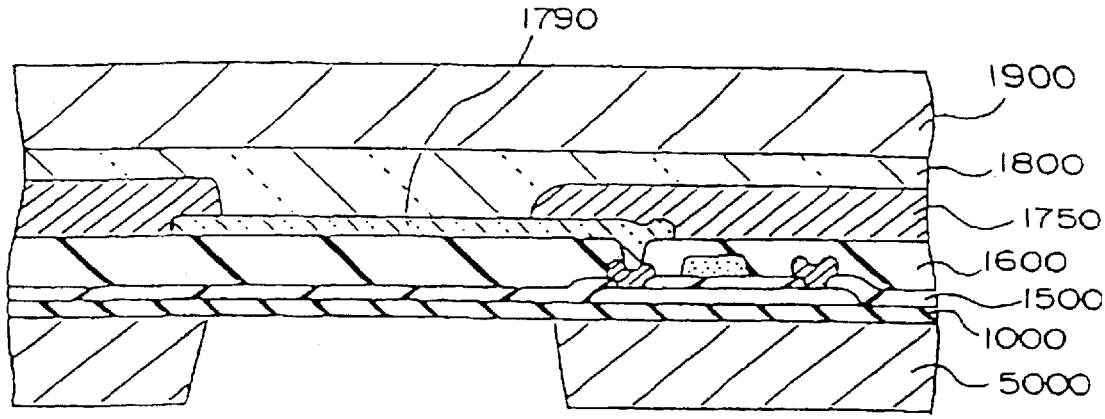
[FIG. 36]
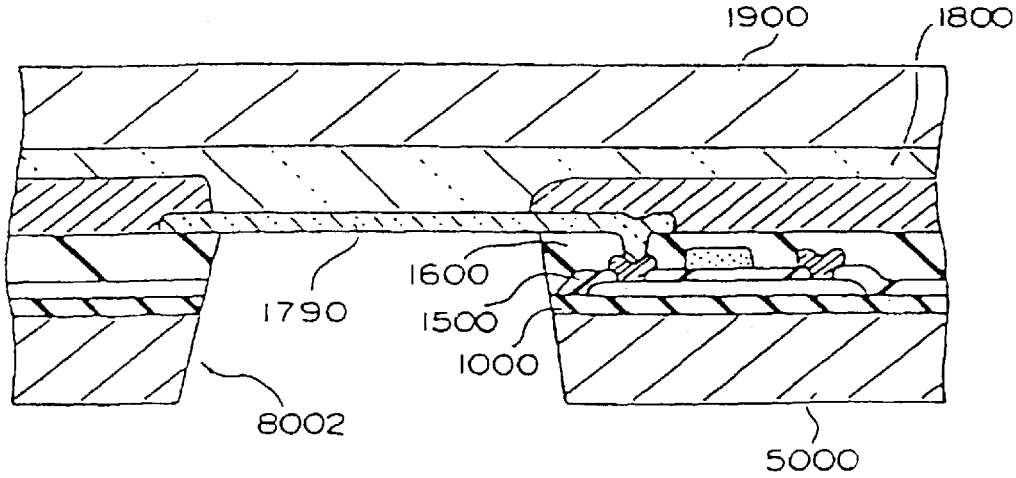

[FIG. 37]
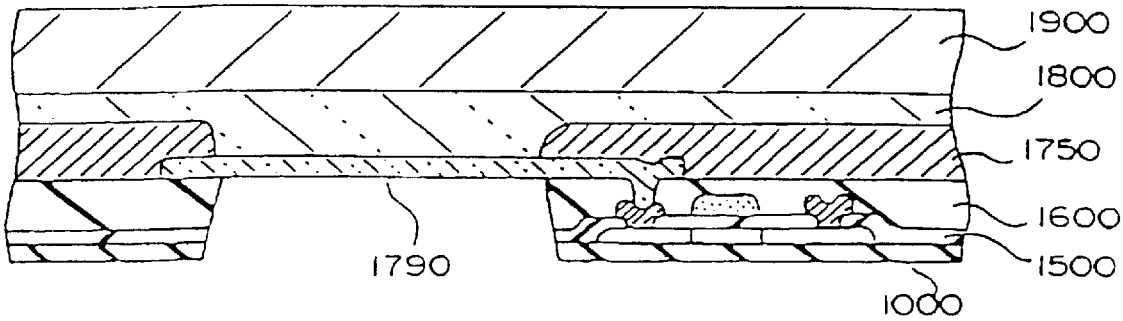

[FIG. 38]
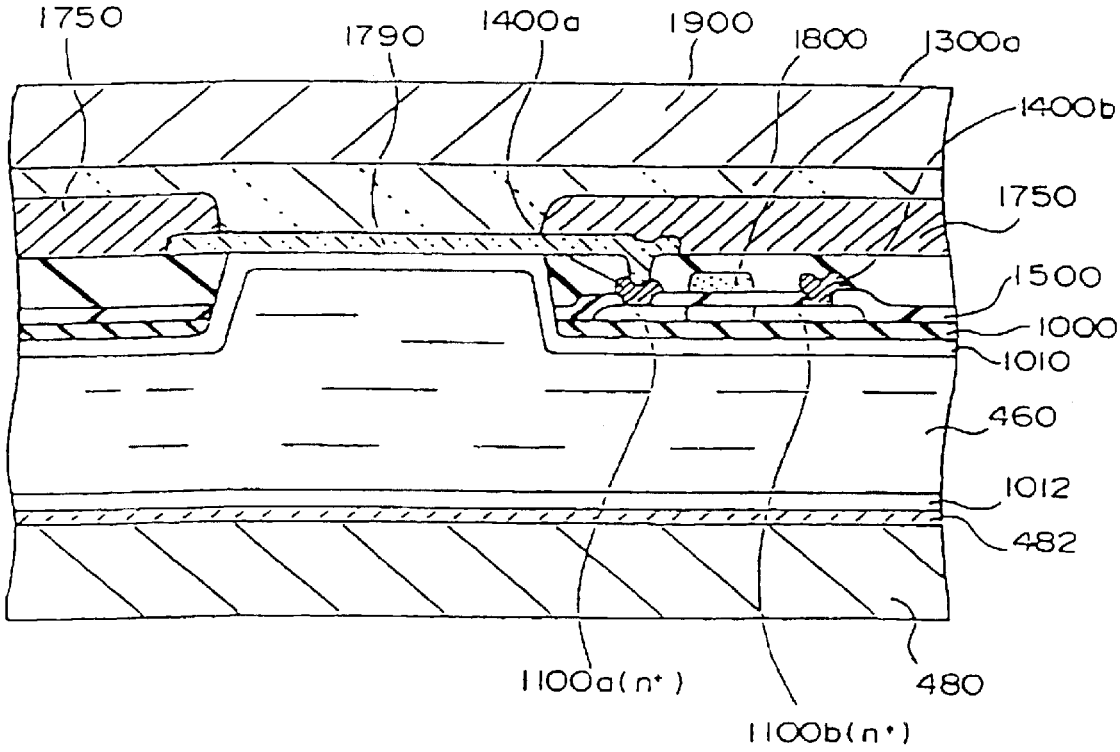

[FIG. 39]
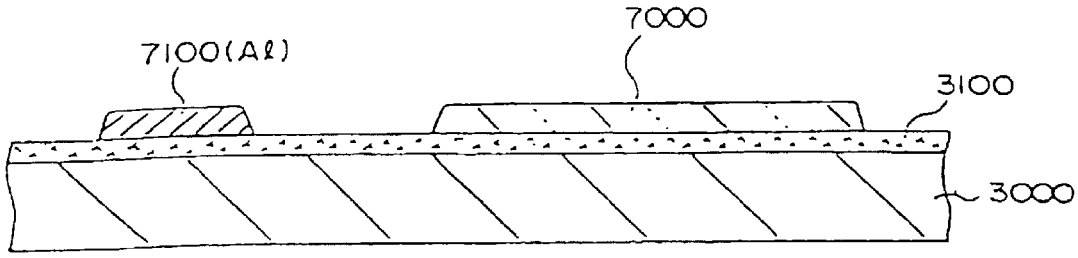
[FIG. 40]
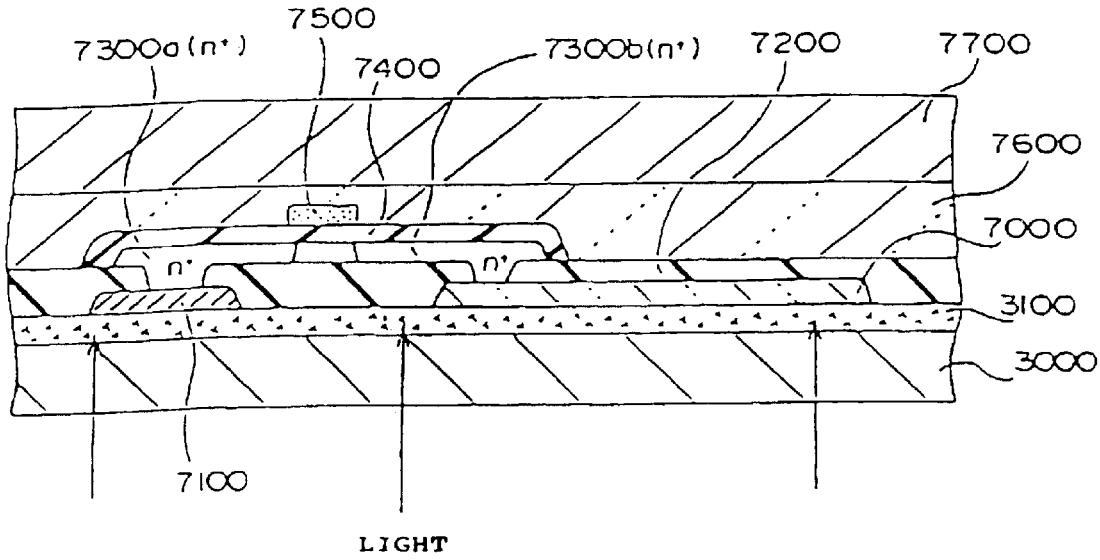

[FIG. 41]
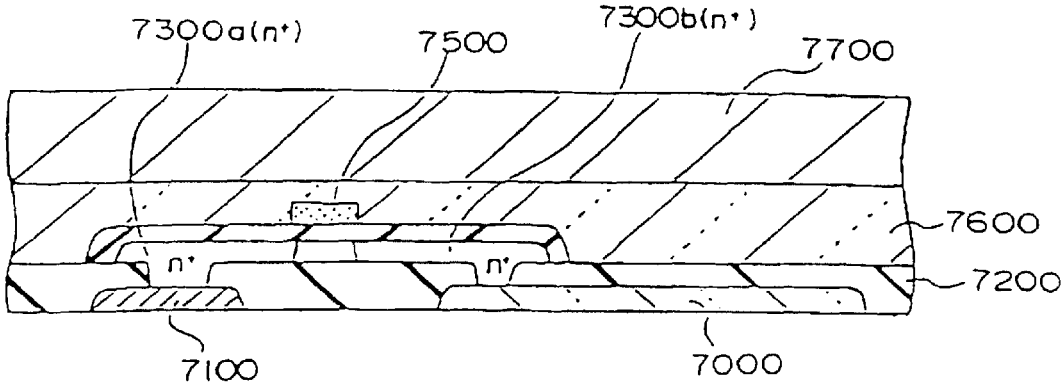
[FIG. 42]
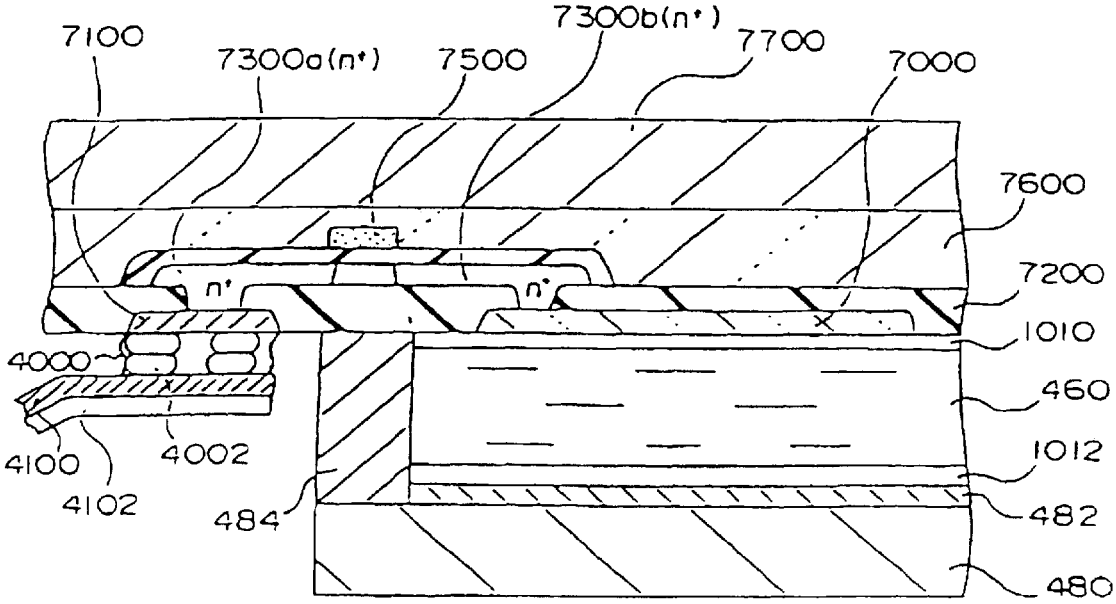

MANUFACTURING METHOD OF ACTIVE MATRIX SUBSTRATE, ACTIVE MATRIX SUBSTRATE AND LIQUID CRYSTAL DISPLAY DEVICE

Matter enclosed in heavy brackets [ ] appears in the original patent but forms no part of this reissue specification; matter printed in italics indicates the additions made by reissue.

*This is one of two (2) reissue applications directed to various aspects of manufacturing method of active matrix substrate, active matrix substrate and liquid crystal display device described in U.S. Pat. No. 6,127,199. The first reissue application is application Ser. No. 10/263,070, filed Oct. 3, 2002. The second reissue application is the present application, which is a Divisional of application Ser. No. 10/263,070. As noted above, this is a Divisional of application Ser. No. 10/263,070, filed Oct. 3, 2002 now Re. 38,466 which is a reissue of U.S. Pat. No. 6,127,199, which corresponds to U.S. patent application Ser. No. 09/113,373 filed Jul. 10, 1998, which is a Continuation-In-Part of Application No. PCT/JP97/04110 filed Nov. 11, 1997.*

CROSS-REFERENCE TO RELATED APPLICATIONS

This application is a continuation-in-Part of international application PCT/JP97/04110, filed on Nov. 11, 1997, which claims priority from Japanese application Nos. 8-315590 and 8-327688, filed on Nov. 12, 1996 and Nov. 22, 1996, respectively. PCT/JP97/04110 and Japanese application Nos. 8-315590 and 8-327688 are incorporated by reference herein in their entirety.

BACKGROUND OF THE INVENTION

1. Field of the Invention

The present invention relates to a method of manufacturing an active matrix substrate using a method of transferring a thin film device. The present invention also relates to an active matrix substrate manufactured by the manufacturing method, and a liquid crystal display device comprising this active matrix substrate as one of a pair of substrates.

2. Description of Related Art

For example, a liquid crystal display using thin film transistors (TFT) is manufactured through the step of forming thin film transistors on a substrate by CVD or the like. Since the step of forming thin film transistors on the substrate is accompanied with high temperature processing, it is necessary to use material for the substrate which has excellent heat resistance, i.e., material having a high softening point and melting point. At present, silica glass is used as a substrate which can resist a temperature of about 10000C, and heat resistant glass is used as a substrate which can resist a temperature of about 500° C.

Namely, the substrate on which thin film elements are mounted must satisfy conditions for producing the thin film transistors. Therefore, the substrate used is determined so as to satisfy conditions for manufacturing a device to be mounted thereon.

However, in consideration of only the steps after the substrate comprising the thin film transistors such as TFT or the like mounted thereon is completed, in some cases, the above-described substrate is not always satisfactory.

For example, in the above-described manufacturing process accompanied with high temperature processing, a quartz substrate, a heat-resistant substrate, or the like is used. However, these substrates are very expensive, and thus cause an increase in product cost.

Also the glass substrate has the properties that it is heavy and easily broken. A liquid crystal display used for portable electronic apparatus such as a palm top computer, a portable telephone, etc. is preferably light weight, can resist a little deformation, and is hardly broken by dropping. However, in fact, the glass substrate is generally heavy, less resistant to deformation and is possibly broken by dropping.

In other words, there are gaps between the limitations caused by manufacturing conditions and preferable characteristics required for products, and it is very difficult to satisfy the conditions and characteristics.

SUMMARY OF THE INVENTION

The present invention has been achieved in consideration of these problems, and an object of the invention is to provide a novel technique which permits independent free selection of a substrate used in producing thin film devices, and a substrate (a substrate having preferable properties for application of a product) used in, for example, actual use of a product, and a completely new method of effectively manufacturing an active matrix substrate having excellent properties and a liquid crystal display device by using the technique.

In order to achieve the object, the present invention may include the following.

(1) The present invention provides a method of manufacturing an active matrix substrate comprising a pixel portion including thin film transistors connected to scanning lines and signal lines arranged in a matrix, and pixel electrodes respectively connected to terminals of the thin film transistors, the method may include:

forming a separation layer on the substrate;

forming the thin film transistors over the separation layer;

forming an insulation film on the thin film transistors and over the separation layer;

selectively removing at least a portion of the insulation film in a region where each of the pixel electrodes is to be formed;

forming each of the pixel electrodes on the insulation film and the separation layer in a region where at least a portion of the insulation film has been removed;

adhering the thin film transistors to a transfer material with an adhesive layer producing exfoliation in the separation layer and/or at an interface of the separation layer and the substrate to separate the substrate from the separation layer; and removing any portion of the separation layer remaining on the pixel electrodes and under the insulation film to form an active matrix substrate using the transfer material as a new substrate.

In the method of manufacturing an active matrix substrate of the present invention, the thin film transistors and the pixel electrodes formed on the substrate are transferred to the desired transfer material by the device transfer technique developed by the applicant of the present invention. In this case, the device transferred onto the transfer material is reverse to a normal device. In the transferred device, consequently, the pixel electrode is covered with the insulator layer such as an interlayer insulation film or the like before transfer. If the insulation film has a large thickness, a large voltage loss occurs in this portion, and thus a sufficient voltage cannot be applied to a liquid crystal.

Therefore, in the manufacturing method of the present invention, in forming the thin film transistors and pixel electrodes on the original substrate before transfer, at least a portion of the insulator layer such as the interlayer insulation film or the like is removed before the pixel electrodes are formed. In this case, the entire insulator layer is preferably removed. However, when the insulation film remaining unremoved is thin, at least a portion of the insulator layer may be removed because no problem occurs in application of a voltage to the liquid crystal.

In any case, by separating the original substrate after a device is transferred onto the transfer material, the pixel electrode partially appears at least in the vicinity of the surface of the device. Therefore, a sufficient voltage can be applied to the liquid crystal layer from this portion.

The insulation film remaining on the pixel electrodes can also be separately removed in another step (for example, in a step after transfer of the device).

(2) The present invention provides a method of manufacturing an active matrix substrate comprising a pixel portion including thin film transistors connected to scanning lines and signal lines arranged in a matrix, and pixel electrodes respectively connected to terminals of the thin film transistors, and the method may include:

forming a separation layer on a substrate;

forming an intermediate layer on the separation layer;

forming the thin film transistors on the intermediate layer;

forming an insulation film on the thin film transistors and the intermediate layer;

selectively removing a portion of the insulation film in a region where each of the pixel electrodes is to be formed;

forming each of the pixel electrodes on the insulation film and the separation layer in the region where at least a portion of the insulation film is removed;

adhering the thin film transistors to a transfer material with an adhesive layer;

producing exfoliation in the separation layer and/or at an interface of the separation layer and the substrate to separate the substrate from the separation layer; and removing any portion of the separation layer remaining on the intermediate layer and the pixel electrodes to form an active matrix substrate using the transfer material as a new substrate.

This invention is different from invention (1) in that the intermediate layer is provided. The intermediate layer can comprise a single layer film of an insulator, such as an $SiO_2$ film or the like, or a multilayered film comprising a laminate of an insulator and a metal. The intermediate layer functions to facilitate separation from the separation layer, protect the transistors from contamination during removal of the separation layer, ensure insulation properties of the transistors, and suppress irradiation of the transistors with laser light.

In forming the thin film transistors and the pixel electrodes on the original substrate before transfer, at least a portion of the insulator layer such as an interlayer insulation film or the like, which causes a problem in the later steps, is removed before the pixel electrodes are formed. In this case, the whole insulation film and intermediate layer below it are preferably removed at the same time from the viewpoint of prevention of a loss of the voltage applied to the liquid crystal. However, where the insulator layer remaining unremoved is thin, a sufficient voltage can be applied to the liquid crystal from the pixel electrodes. Therefore, at least a portion of the insulation film may be removed.

In the present invention, by separating the original substrate after a device is transferred to the transfer material, the pixel electrode partially appears at least in the vicinity of the surface of the device. Therefore, a voltage can sufficiently be applied to the liquid crystal layer from this portion.

The insulation film remaining on the pixel electrodes can separately be removed in another step (for example, the step after transfer of the device).

(3) In invention (2), at least a portion of the insulation film may be selectively removed in the step of forming contact holes for electrically connecting the pixel electrodes to the thin film transistors. Since the same manufacturing step is used for both purposes, an increase in the number of the manufacturing steps can be prevented.

(4) In invention (3), the contact holes may be used for connecting the pixel electrodes directly to an impurity layer which constitutes the thin film transistors.

Namely, in a structure in which the pixel electrodes are connected directly to terminals(source layer or drain layer) of the thin film transistors, the insulator layer such as an interlayer insulation film or the like may be removed in formation of the contact holes for connection.

(5) In invention (3), the contact holes may be used for connecting the pixel electrodes to respective electrodes connected to an impurity layer which constitutes the thin film transistors.

Namely, in a structure in which the pixel electrodes are connected to terminals(the source layer or drain layer) of the thin film transistors through electrodes made of a metal or the like (when the pixel electrodes are in a layer above the electrodes of the transistors), the insulator layer such as an interlayer insulation film or the like may be removed in formation of the contact holes for connection.

(6) In any one of inventions (1) to (5), at least one of a color filter and a light shielding film may be after the step of forming the pixel electrodes.

In the structure of normal thin film transistors, if the color filter or the light shielding film is formed on the pixel electrodes, application of a voltage to the liquid crystal layer from the pixel electrodes is interfered with, and thus such a structure cannot be used.

However, in the present invention, a device is reversed by transfer, and thus the region where a voltage is applied to the liquid crystal layer from the pixel electrode is formed on the side (i.e., the thin film transistor side) opposite to a conventional device. Therefore, even if the color filter or the light shielding film has been previously formed on the original substrate before transfer, no trouble occurs. In this case, only common electrodes may be formed on the opposite substrate, and the color filter or the light shielding film, which is conventionally formed on the opposite substrate, need not be strictly aligned with the pixel electrodes, thereby facilitating assembly of a liquid crystal display device.

(7) In any one of inventions (1) to (6), in selectively removing at least a portion of the insulation film, at least a portion of the insulation film may be selectively removed in a region where an external connection terminal is to be provided.

In an active matrix substrate, where the external connection terminal (for example, a terminal for connecting a liquid crystal driving IC) is required, this terminal also must be at a position near at least the surface of the device.

Therefore, in the region where the external connection terminal is provided, the insulator film such as an interlayer insulation film or the like is removed. In this case, the under insulation film (intermediate layer) must be removed in the same step or a different step.

(8) In invention (7), in the region where at least a portion of the insulation film is selectively removed for providing the external connection terminal, a conductive layer formed from the same material as the pixel electrodes or an electrode connected to an impurity layer which constitutes the thin film transistors may be formed. In this invention, the conductive layer may be used for forming the external connection terminal.

(9) The present invention also may provide a method of manufacturing an active matrix substrate having a pixel portion including thin film transistors connected to scanning lines and signal lines arranged in a matrix, and pixel electrodes connected to terminals of the thin film transistors, and the method may include:

forming a separation layer on a transmissive substrate;

forming the thin film transistors over the separation layer or on a predetermined intermediate layer formed on the separation layer;

forming an insulation film on the thin film transistors;

forming the pixel electrodes comprising a transparent conductive material on the insulation film;

forming a light shielding layer that is overlapped with the thin film transistors and is not overlapped with at least a portion of the pixel electrodes;

adhering the thin film transistors and the light shielding layer on a transmissive transfer material with a transmissive adhesive layer;

irradiating the separation layer with light through the transmissive substrate to produce exfoliation in the separation layer and/or at an interface of the separation layer and the transmissive substrate to separate the transmissive substrate from the separation layer;

forming a photoresist on a surface from which the transmissive substrate is separated, or on the surface of a layer which appears after removing any remaining portion of the separation layer;

irradiating light to expose only a predetermined portion of the photoresist using the light shielding layer as a mask, followed by development to form a desired photoresist mask;

selectively removing at least a portion of the intermediate layer and the insulation film or at least a portion of the insulation film using the photoresist mask; and removing the photoresist mask to form an active matrix substrate using the transfer material as a new substrate.

Although, in inventions (1) to (8), at least a portion of the insulator layer below the pixel electrodes may be removed before transfer, in this invention, at least a portion of the insulator layer below the pixel electrodes may be removed in a self alignment manner using the light shielding film after transfer.

Namely, the light shielding layer may be formed on the original substrate before transfer, and may be used as an exposure mask after transfer to form a desired resist pattern by utilizing the fact that the light shielding layer is formed around the pixel electrodes. Then, at least a portion of the insulator layer below the pixel electrodes may be removed by using the resist pattern as an etching mask.

(10) This invention provides a method of manufacturing an active matrix substrate having a pixel portion including thin film transistors connected to scanning lines and signal lines arranged in a matrix, and pixel electrodes respectively connected to terminals of the thin film transistors, and the method may include:

forming a separation layer on a substrate;

forming the pixel electrodes over the separation layer or on a predetermined intermediate layer formed on the separation layer;

forming an insulation film on the pixel electrodes, forming the thin film transistors on the insulation film, and respectively connecting the thin film transistors to the pixel electrodes;

adhering the thin film transistors to a transfer material with an adhesive layer;

producing exfoliation in the separation layer and/or at an interface of the separation layer and the substrate to separate the substrate from the separation layer; and removing any portion of the separation layer remaining on the intermediate layer to form an active matrix substrate using the transfer material as a new substrate.

In this invention, when the thin film transistors are formed on the original substrate before transfer, the pixel electrodes are previously formed. The original substrate before transfer is separated after transfer to automatically expose the surfaces of the pixel electrodes or position the pixel electrodes at least at the surface of the device.

(11) In invention (10), a conductive material layer may be formed on the separation layer or on the intermediate layer at a position where an external connection terminal is to be formed.

When the thin film transistors are formed on the original substrate before transfer, the conductive material layer for forming the external connection terminal is previously formed as well as the pixel electrode. The original substrate before transfer is separated after transfer to automatically expose the surface of the conductive material layer at the same time as the pixel electrodes, or position the conductive material layer near the surface, leaving the intermediate layer. In the latter case, the intermediate layer is removed in the same step or a different step to expose the surface of the conductive material layer. The conductive material layer with the exposed surface serves as the external connection terminal.

(12) This invention provides an active matrix substrate manufactured by the method of manufacturing an active matrix substrate of any one of inventions (1) to (11). Since limitations due to the manufacturing conditions are eliminated so that the substrate can freely be selected, a novel active matrix substrate, which has not yet been realized, can be realized.

(13) This invention provides a liquid crystal display device comprising an active matrix substrate manufactured by the method of manufacturing an active matrix substrate of any one of inventions (1) to (11). For example, it is possible to realize an active matrix type liquid crystal display device comprising a plastic substrate and having flexibility.

BRIEF DESCRIPTION OF THE DRAWINGS

FIG. 1 is a sectional view showing the first step of a method of transferring a thin film element.

FIG. 2 is a sectional view showing the second step of a method of transferring a thin film element.

FIG. 3 is a sectional view showing the third step of a method of transferring a thin film element.

FIG. 4 is a sectional view showing the fourth step of a method of transferring a thin film element.

FIG. 5 is a sectional view showing the fifth step of a method of transferring a thin film element.

FIG. 6 is a sectional view showing the sixth step of a method of transferring a thin film element.

FIG. 7 is a drawing illustrating the whole configuration of a liquid crystal display device.

FIG. 8 is a drawing illustrating the configuration of a principal portion of a liquid crystal display device.

FIG. 9 is a sectional view illustrating the structure of a principal portion of a liquid crystal display device.

FIG. 10 is a sectional view showing the first step of a method of manufacturing an active matrix substrate in accordance with a first embodiment of the present invention.

FIG. 11 is a sectional view showing the second step of the method of manufacturing an active matrix substrate in accordance with the first embodiment of the present invention.

FIG. 12 is a sectional view showing the third step of the method of manufacturing an active matrix substrate in accordance with the first embodiment of the present invention.

FIG. 13 is a sectional view showing the fourth step of the method of manufacturing an active matrix substrate in accordance with the first embodiment of the present invention.

FIG. 14 is a sectional view showing the fifth step of the method of manufacturing an active matrix substrate in accordance with the first embodiment of the present invention.

FIG. 15 is a sectional view showing the first step of a method of manufacturing an active matrix substrate in accordance with a modified embodiment of the first embodiment.

FIG. 16 is a sectional view showing the second step of the method of manufacturing an active matrix substrate in accordance with the modified embodiment of the first embodiment.

FIG. 17 is a sectional view showing the third step of the method of manufacturing an active matrix substrate in accordance with the modified embodiment of the first embodiment.

FIG. 18 is a sectional view showing the first step of a method of manufacturing an active matrix substrate in accordance with a second embodiment of the present invention.

FIG. 19 is a sectional view showing the second step of the method of manufacturing an active matrix substrate in accordance with the second embodiment of the present invention.

FIG. 20 is a sectional view showing the structure of a principal portion of a liquid crystal display device in accordance with a third embodiment of the present invention.

FIG. 21 is a drawing showing electrical connection in the liquid crystal display device shown in FIG. 20.

FIG. 22 is a sectional view showing the first step of a method of manufacturing an active matrix substrate in accordance with the third embodiment of the present invention.

FIG. 23 is a sectional view showing the second step of the method of manufacturing an active matrix substrate in accordance with the third embodiment of the present invention.

FIG. 24 is a sectional view showing the third step of the method of manufacturing an active matrix substrate in accordance with the third embodiment of the present invention.

FIG. 25 is a sectional view showing the fourth step of the method of manufacturing an active matrix substrate in accordance with the third embodiment of the present invention.

FIG. 26 is a sectional view showing the fifth step of the method of manufacturing an active matrix substrate in accordance with the third embodiment of the present invention.

FIG. 27 is a sectional view showing the sixth step of the method of manufacturing an active matrix substrate in accordance with the third embodiment of the present invention.

FIG. 28 is a sectional view showing the first step of a method of manufacturing an active matrix substrate in accordance with a modified embodiment of the third embodiment.

FIG. 29 is a sectional view showing the second step of the method of manufacturing an active matrix substrate in accordance with the modified embodiment of the third embodiment.

FIG. 30 is a sectional view showing the third step of the method of manufacturing an active matrix substrate in accordance with the modified embodiment of the third embodiment.

FIG. 31 is a sectional view showing the first step of a method of manufacturing an active matrix substrate in accordance with a fourth embodiment of the present invention.

FIG. 32 is a sectional view showing the second step of the method of manufacturing an active matrix substrate in accordance with the fourth embodiment of the present invention.

FIG. 33 is a sectional view showing the third step of the method of manufacturing an active matrix substrate in accordance with the fourth embodiment of the present invention.

FIG. 34 is a sectional view showing the fourth step of the method of manufacturing an active matrix substrate in accordance with the fourth embodiment of the present invention.

FIG. 35 is a sectional view showing the fifth step of the method of manufacturing an active matrix substrate in accordance with the fourth embodiment of the present invention.

FIG. 36 is a sectional view showing the sixth step of the method of manufacturing an active matrix substrate in accordance with the fourth embodiment of the present invention.

FIG. 37 is a sectional view showing the seventh step of the method of manufacturing an active matrix substrate in accordance with the fourth embodiment of the present invention.

FIG. 38 is a sectional view of a liquid crystal display device in accordance with the fourth embodiment of the present invention.

FIG. 39 is a sectional view showing the first step of a method of manufacturing an active matrix substrate in accordance with a fifth embodiment of the present invention.

FIG. 40 is a sectional view showing the second step of the method of manufacturing an active matrix substrate in accordance with the fifth embodiment of the present invention.

FIG. 41 is a sectional view showing the third step of the method of manufacturing an active matrix substrate in accordance with the fifth embodiment of the present invention.

FIG. 42 is a sectional view of a liquid crystal display device in accordance with the fifth embodiment of the present invention.

DETAILED DESCRIPTION OF PREFERRED EMBODIMENTS

An exfoliating method in accordance with an embodiment of the present invention is described in detail below with reference to the attached drawings.

In the present invention, an active matrix substrate is formed by using "the device transfer technique" developed by the applicant of this invention. Therefore, the contents of "the device transfer technique" are first described.

(Contents of device transfer technique)

FIGS. 1 to 6 are drawings illustrating the contents of the device transfer technique.

[Step 1]

As shown in FIG. 1, a separation layer (light absorbing layer) 120 is formed on a substrate 100.

The substrate 100 and the separation layer 120 are described.

(1) Description of the substrate 100

The substrate 100 preferably has transmissivity which allows transmission of light. In this case, the light transmittance is preferably 10% or more, and more preferably 50% or more. With too low transmittance, attenuation (loss) of light is increased, and thus a large quantity of light is required for exfoliating the separation layer 120.

Also the substrate 100 is preferably made of a material having high reliability, particularly a material having excellent heat resistance. The reason for this is that for example, when a transferred layer 140 or an intermediate layer 142, which will be described below, are formed, the process temperature is sometimes increased (for example, about 350 to 1000° C.) according to the type and the forming method. However, in this case, in forming the transferred layer 140 or the like on the substrate 100 having excellent heat resistance, the ranges of the film forming conditions such as the temperature condition, etc. are widened.

Therefore, if the highest temperature in formation of the transferred layer 140 is Tmax, the substrate 100 is preferably made of a material having a strain point higher than Tmax. Specifically, the material for forming the substrate 100 preferably has a strain point of 350° C. or higher, more preferably 500° C. or higher. Examples of such materials include heat resistant glass such as quartz glass, Corning 7059, Nihon Denki glass OA-2, and the like Although the thickness of the substrate 100 is not limited, the thickness is preferably about 0.1 to 5.0 mm, more preferably about 0.5 to 1.5 mm. With the substrate 100 having an excessively small thickness, the strength deteriorates, and with the substrate 100 having an excessively large thickness, attenuation of light easily occurs when the substrate 100 exhibits low transmittance. When the substrate 100 exhibits high transmittance, the thickness thereof may exceed the upper limit. In order to permit uniform irradiation, the substrate 100 preferably has a uniform thickness.

(2) Description of the separation layer 120

The separation layer 120 has the property of absorbing light to produce exfoliation in the layer and/or the interface thereof (referred to as "internal exfoliation" and "interfacial exfoliation" hereinafter), and preferably, the adhering strength between the atoms or molecules of the material which constitutes the separation layer 120 is reduced or eliminated by irradiation of light, i.e., internal exfoliation and/or interfacial exfoliation results from ablation.

Further, in some cases, gases are discharged from the separation layer 120 by irradiation of light to cause a separating effect. Namely, the components contained in the separation layer 120 are discharged as gases, or the separation layer 120 absorbs light to become a gas for a moment and the vapor is discharged to contribute to separation. Examples of the composition of the separation layer 120 include the following A to E.

A. Amorphous silicon (a-Si)

Amorphous silicon may contain hydrogen (H). In this case, the H content is preferably about 2 atomic % or more, more preferably about 2 to 20 atomic %. When a predetermined amount of hydrogen (H) is present, hydrogen is discharged by irradiation of light to generate internal pressure in the separation layer 120, which serves as the force to exfoliate upper and lower thin films. The content of hydrogen (H) in amorphous silicon can be adjusted by appropriately setting film deposition conditions, e.g., the gas composition, gas pressure, gas atmosphere, gas flow rate, temperature, substrate temperature, input power, etc. of CVD.

B. Various oxide ceramics such as silicon oxide or silicates, titanium oxide or titanates, zirconium oxide or zirconates, lanthanum oxide or lanthanates, and the like, dielectric material (ferroelectric material) or semiconductor.

Examples of silicon oxides include SiO, $SiO_2$ and $Si_3O_2$, and examples of silicate compounds include $K_2SiO_3$, $Li_2SiO_3$, $CaSiO_3$, $ZrSiO_4$, and $Na_2SiO_3$.

Examples of titanium oxides include Tio, $Ti_2O_3$ and $TiO_2$, and examples of titanate compounds include $BaTiO_4$, $BaTiO_3$, $Ba_2Ti_9O_{20}$, $BaTi_5O_1l$, $CaTiO_3$, $SrTiO_3$, $PbTiO_3$, $MgTiO_3$, $ZrTiO_2$, $SnTiO_4$, $Al_2TiO_5$, and $FeTiO_3$.

Zirconium oxide is $ZrO_2$, and examples of zirconate compounds include $BaZrO_3$, $ZrSiO_4$, $PbZrO_3$, $MgZrO_3$, and $K_2ZrO_3$.

C. Ceramics such as PZT, PLZT, PLLZT, PBZT and the like, or dielectric material (ferroelectric material)

D. Nitride ceramics such as silicon nitride, aluminum nitride, titanium nitride, and the like.

E. Organic polymer material

As an organic polymer material, any material having bonds such as —CH—, —CO— (ketone), —CONH— (amido), —NH— (imido), COO— (ester), —N═N— (azo), —CH═N— (Schiff) or the like (these bonds are cut by light irradiation), particularly any material having many bonds of such a type can be used. The organic polymer material may have an aromatic hydrocarbon (at least one benzene ring or condensed ring thereof) in the composition thereof.

Examples of such organic polymer materials include polyolefines such as polyethylene and polypropylene, polyimide, polyamide, polyester, polymethylmethacrylate (PMMA), polyphenylenesulfide (PPS), polyethersulfone (PES), epoxy resins, and the like.

F. Metal

Examples of metals include Al, Li, Ti, Mn, In, Sn, Y, La, Ce, Nd, Pr, Gd, Sm, and alloys containing at least one of these metals.

Although the thickness of the separation layer 120 depends upon conditions such as the purpose of exfoliation, the composition of the separation layer 120, the layer structure, the forming method, etc., the thickness is preferably about 0.5 nm to 20 pm, more preferably about 1 nm to 2 μm, most preferably about 5 nm to 1 μm. With the separation layer 120 having an excessively small thickness, uniformity of film deposition deteriorates, thereby causing nonuniformity in exfoliation. With the separation layer 120 having an excessively large thickness, the power of light (quantity of light) must be increased to ensure good exfoliating properties of the separation layer 120, and much time is required for removing the separation layer 120 later. The thickness of the separation layer 120 is preferably as uniform as possible.

The method of forming the separation layer 2 is not limited, and is appropriately selected according to conditions such as the film composition, the thickness, and the like. Examples of the forming method include various vapor phase deposition methods such as CVD (including MOCVD, low-pressure CVD and ECR-CVD), evaporation, molecular beam evaporation (MB), sputtering, ion plating, PVD, and the like; various plating methods such as electroplating, immersion plating (dipping), electroless plating, and the like; coating methods such as Langmuir-Blodgett's (LB) technique, spin coating, spray coating, roll coating, and the like; various printing methods; a transfer method; an ink jet method; a powder jet method; and the like. The separation layer may be formed by a combination of at least two of these methods.

For example, where the composition of the separation layer 120 comprises amorphous silicon (a-Si), the layer is preferably formed by CVD, particularly low-pressure CVD or plasma CVD.

Where the separation layer 120 is made of ceramic by a sol-gel method, or an organic polymer material, it is preferably formed by a coating method, particularly spin coating.

[Step 2]

Next, the transferred layer (thin film device layer) 140 is formed on the separation layer 120, as shown in FIG. 2.

An enlarged section of portion K (shown by a one-dot chain line in FIG. 2) of the thin film device layer 140 is shown on the right side of FIG. 2. As shown in FIG. 2, the thin film device layer 140 comprises TFTs (thin film transistor) formed on, for example, an $SiO_2$ film (intermediate layer) 142, and the TFT comprises source and drain layers 146 formed by introducing N-type impurities in a polysilicon layer, a channel layer 144, a gate insulation film 148, a polysilicon gate 150, a protecting film 154, and an electrode 152 made of, for example, aluminum.

Although, in this embodiment, as the intermediate layer provided in contact with the separation layer 120, the $SiO_2$ film is used, another insulation film can also be used. The thickness of the $SiO_2$ film (intermediate layer) is appropriately determined according to the purpose of forming, the degree of the function exhibited, but the thickness is preferably about 10 nm to 5 μm, more preferably about 40 nm to 1 μm. The intermediate layer is formed for various purposes. For example, the intermediate layer is formed for exhibiting at least one of the functions as a protection layer for physically or chemically protecting the transferred layer 140, an insulation layer, a conductive layer, laser light shielding layer, a barrier layer for preventing migration, and a reflecting layer.

In some cases, the intermediate layer comprising the $SiO_2$ film or the like is not formed, and the transferred layer (thin film layer) 140 may be formed directly on the separation layer 120. An example of cases in which the intermediate layer need not be provided is a case in which a TFT in the transferred layer is a bottom gate structure transistor, and no problem with contamination occurs even if the bottom gate is exposed to the surface after transfer.

The transferred layer 140 (thin film device layer) is a layer containing thin film devices such as TFTs or the like, as shown on the right hand side of FIG. 2. Besides TFTs, examples of thin film devices include thin film diodes and other thin film semiconductor devices, electrodes (for example, transparent electrodes such as ITO and mesa films), switching devices, memory, actuators such as piezoelectric devices, micro mirrors (piezo thin film ceramics), magnetic recording thin film heads, coils, inductors, thin film materials with high permeability and micro magnetic devices comprising a combination of these materials, filters, reflecting films, dichroic mirrors, and the like.

Such a thin film device is generally formed through a relatively high process temperature in relation to the forming method thereof. Therefore, in this case, the substrate 100 must-resist the process temperature and have high reliability, as described above.

[Step 3]

Next, the thin film device layer 140 is adhered to a transfer material 180 through an adhesive layer 160, as shown in FIG. 3.

Preferable examples of an adhesive which constitutes the adhesive layer 160 include various curing adhesives such as reactive curing adhesives, heat curing adhesives, light curing adhesives such as ultraviolet curing adhesives, anaerobic curing adhesives, and the like. As the composition of the adhesive, any type such as an epoxy type, an acrylate type, or a silicone type, may be used. The adhesive layer 160 is formed by, for example, the coating method.

In the use of the curing adhesive, for example, the curing adhesive is coated on the transferred layer (thin film device layer) 140, the transfer material 180 is adhered to the curing adhesive, and then the curing adhesive is cured by the curing method according to the properties of the curing adhesive, to bond and fix the transferred layer (thin film device layer) 140 and the transfer material 180.

Unlike the case shown in the drawing, the adhesive layer 160 may be formed on the transfer material 180 side, and the transferred layer (thin film device layer) 140 may be adhered to the adhesive layer 160. For example, when the transfer material 180 has the adhesive function, the formation of the adhesive layer 160 may be omitted.

Although the transfer material 180 is not limited, a substrate, particularly a transparent substrate can be used. Such a substrate may be a flat plate or a curved plate. As the transfer material 180, a material having heat resistance, corrosion resistance, and the like which are poorer than the substrate 100 may be used. The reason for this is that in the present invention, since the transferred layer (thin film device layer) 140 is formed on the substrate 100 side, and is then transferred to the transfer material 180, the conditions required for the transferred layer (thin film device layer) 140, particularly, heat resistance, does not depend upon the temperature conditions in forming the transferred layer (thin film device layer) 140.

Therefore, when the highest temperature in formation of the transferred layer 140 is Tmax, as the material for forming the transfer material 180, a material having a glass transition point (Tg) or softening point lower than Tmax can be used. For example, the transfer material 180 preferably comprises a material having a glass transition point (Tg) or softening point of 800° C. or less, more preferably 500° C. or less, most preferably 320° C. or less.

The transfer material 180 may have as a mechanical property some rigidity (strength), but it may have flexibility and elasticity.

As the material which constitutes the transfer material 180, various synthetic resins or various types of glass may be used, particularly various synthetic resins or inexpensive ordinary glass materials (low melting point) are preferably used.

Synthetic resins may be either thermoplastic resins or heat curing resins. Examples of such synthetic resins include polyolefins such as polyethylene, polypropylene, ethylene-propylene copolymers, ethylene-vinyl acetate copolymers (EVA), and the like; cyclic polyolefins; modified polyolefins; polyvinyl chloride; polyvinylidene chloride; polystyrene; various polyesters such as polamide, polyimide, polycarbonate, poly-(4-methylpentene-1), ionomer, acrylic resins, polymethyl methacrylate, acryl-styrene copolymers (AB resins), butadiene-styrene copolymers, polyolefin copolymers (EVOH), polyetheyele terephthalate (PET), polubutylene terephthalate (PBT), polycyclohexane terephthalate (PCT), and the like; polyethers; polyether ketones (PEK); polyether ether ketones (PEKK); polyether imide; polyacetal (POM); polyphenylene oxide; modified polyphenyl oxide; polyacrylate; aromatic polyetsers (liquid crystal polymers); polytetrafluoroethene; polyvinylene fluoride; other fluororesins; various thermoplastic elastomers of styrene, polyolefin, polyvinyl chloride, polyurethane, fluororubber, chlorinated polyethylene, and the like; epoxy resins; phenolic resins; urea resins; melamine resins; unsaturated polyesters; silicone resins; polyurethane; and copolymers, blends and polymer alloys mainly consisting of these polymers; the like. These polymers may be used singly or in combination of at least two of them (for example, as a laminate of at least two layers).

Examples of glass materials include silicate glass (quartz glass), alkali silicate glass, soda-lime glass, potash lime glass, lead (alkali) glass, barium glass, borosilicate glass, and the like. Of these types of glass, glass other than silicate glass is preferable because it has a melting point lower than silicate glass, is relatively easily formed and processed, and inexpensive.

When a member made of a synthetic resin is used as the transfer material 180, there are various advantages that the large transfer material 180 can be integrally formed, the member having a complicated shape such as a curved surface or an unevenness can easily be produced, and the material cost and production cost are low. Therefore, the use of a synthetic resin is advantageous for producing a large low-priced device (for example, a liquid crystal display).

The transfer material 180 may comprise an independent device, such as a liquid crystal cell, or a portion of a device, such as a color filter, an electrode layer, a dielectric layer, an insulation layer or a semiconductor device.

The transfer material 180 may be made of a material such as a metal, ceramic, a stone material, wood paper, or the like, or may comprise any desired surface which constitutes a product (a surface of a watch, a surface on an air conditioner, a surface of a printed board, or the like), or a surface of a structure, such as a wall, a column, a ceiling, a window glass, or the like.

[Step 4]

Next, the substrate 100 is irradiated with light from the back thereof, as shown in FIG. 4.

The light passes through the substrate 100 and is then applied to the separation layer 120. This causes internal exfoliation and/or interfacial exfoliation in the separation layer 120, thereby decreasing or eliminating the adhering strength.

The principle of occurrence of internal exfoliation and/or interfacial exfoliation in the separation layer 120 is thought to be based on ablation occurring in the constituent material of the separation layer 120, discharge of gases contained in the separation layer 120 and a phase change such as melting or vaporization caused immediately after irradiation.

The ablation means that a solid material (the constituent material of the separation layer 120) which absorbs light is photochemically or thermally excited to discharge atoms or molecules due to cutting of bonds in the surface and inside of the material. This mainly occurs as the phenomenon that a phase change such as melting, vaporization (evaporation) or the like occurs in the whole or part of the constituent material of the separation layer 120. Also, in some cases, the phase change causes a fine foam state, and decreases the adhering strength.

The type of the exfoliation produced in the separation layer 120, i.e., internal exfoliation, interfacial exfoliation or both types of exfoliation, depends upon the composition of the separation layer 120, and other various factors. One of the factors is the type, wavelength, strength, arrival depth and the like of irradiating light.

As the irradiating light, any light can be used as long as it generates internal exfoliation and/or interfacial exfoliation in the separation layer 120. Examples of the irradiating light include X-rays, ultraviolet rays, visible light, infrared light (heat rays), laser light, millimeter waves, microwaves, electron rays, radiation ($\alpha$-rays, $\beta$-rays and $\gamma$-rays), and the like. Of these types of light, laser light is preferable from the viewpoint that exfoliation (ablation) is easily produced in the separation layer 120.

As a laser device for generating laser light, various gas lasers, solid lasers (semiconductor lasers), and the like can be used. However, an eximer laser, an Nd-YAG laser, an Ar laser, a $CO_2$ laser, a CO laser, an He—Ne laser and the like are preferably used, and an eximer laser is particularly preferable.

Since the eximer laser outputs high energy in a short wavelength region, it can generate ablation in the separation layer 120 within a very short time, and thus peel off the separation layer 120 with hardly producing a temperature rise in the transfer material 180 and the substrate 100 adjacent to the separation layer 120, i.e., with producing neither deterioration nor damage.

In producing ablation in the separation layer 120, the wavelength of the irradiating laser light is preferably about 100 to 350 nm. In regard to the transmittance of the substrate 100 for the light wavelength, the substrate 100 has the property that transmittance for a wavelength of 250 nm rapidly increases. In this case, irradiation is performed with light at a wavelength over 300 nm (for example, Xe—Cl eximer laser light with 308 nm).

For example, when a phase change such as gas discharge, evaporation or sublimation is generated in the separation layer 120 to provide a separation property, the wavelength of the irradiating laser light is preferably about 350 to 1200 nm.

The energy density of the irradiating laser light, particularly the energy density of eximer laser, is preferably about 10 to 5000 mJ/cm$^2$, more preferably about 100 to 500 mJ/cm$^2$. The irradiation time is preferably about 1 to 1000 nsec, more preferably about 10 to 100 nsec. With a low energy density or a short irradiation time, sufficient ablation does not occur, and with a high energy density or a long irradiation time, the irradiating light transmitted through the separation layer 120 might produce adverse effects on the transferred layer 140.

As a measure against the adverse effects caused by arrival of the irradiating light transmitted through the separation layer at the transferred layer 140, for example, a metal film of tantalum (Ta) or the like is formed on the separation layer (laser absorbing layer) 120. This causes the laser light transmitted through the separation layer 120 to be totally reflected by the interface of the metal film, thereby causing no adverse effect on the thin film element provided thereon.

Irradiation is preferably performed with the irradiating light, typically laser light, so that the strength is made uniform. The irradiation direction of the irradiating light is not limited to the direction perpendicular to the separation layer 120, and the irradiation direction may be a direction at a predetermined angle with respect to the separation layer 120.

Where the area of the separation layer 120 is larger than the irradiation area of the irradiating light in one irradiation, the total region of the separation layer 120 can be irradiated several times with the irradiating light. The same position may be irradiated two times or more, or the same region or different regions may be irradiated with different types of irradiating light (laser light) or irradiating light at different wavelengths (wavelength ranges).

Next, as shown in FIG. 5, force is applied to the substrate 100 to separate the substrate 100 from the separation layer 120. Although not shown in FIG. 5, the separation layer sometimes adheres to the substrate 100 after separation.

Next, as shown in FIG. 6, the remaining separation layer 120 is removed by, for example, washing, etching, ashing, polishing or a combination thereof. As a result, the transferred layer (thin film device layer) 140 is transferred to the transfer material 180.

When part of the separation layer also adheres to the separated substrate 100, it is removed by the same method as described above. When the substrate 100 is made of an expensive material such as quartz glass or a rare material, the substrate is preferably recycled. Namely, the present invention can be applied to the substrate 100, which is desired to be recycled, with high availability.

The transferred layer (thin film device layer) 140 is completely transferred to the transfer material 180 through the above steps. Then the $SiO_2$ film adjacent to the transferred layer (thin film device layer) 140 may be removed. and a desired protecting film may be formed.

In the present invention, since the transferred layer (thin film device layer) 140, which is a layer to be exfoliated, is not directly exfoliated, but exfoliated through the separation layer adhered thereto, the transferred layer 140 can easily, securely and uniformly be exfoliated (transferred) regardless of the properties of the layer to be exfoliated (the transferred layer 140), and conditions, etc., without damage to the layer to be exfoliated (the transferred layer 140) due to the exfoliating operation. Therefore, it is possible to maintain the high reliability of the transferred layer 140.

The device transfer technique is summarized above.

Next, an example of the method of manufacturing a liquid crystal display device using the above device transfer technique is described.

(First embodiment)

In this embodiment, an example of the process for manufacturing an active matrix type liquid crystal display device comprising an active matrix substrate, as shown in FIGS. 7, 8 and 9, using the thin film device transfer technique is described.

(Configuration of liquid crystal display device)

As shown in FIG. 7, an active matrix type liquid crystal display device comprises backlights 400, a polarizer 420, an active matrix substrate 440, a liquid crystal 460, an opposite substrate 480, and a polarizer 500. In the present invention, when a flexible substrate is used as each of the active matrix substrate 440 and the opposite substrate 480, a lightweight active matrix type liquid crystal panel having flexibility and resistance to shock can be realized as a reflective liquid crystal panel by using a reflecting plate in place of the illumination light sources 400.

The active matrix substrate 440 used in this embodiment is an active matrix substrate with a built-in driver in which TFTs are arranged in a pixel portion 442, and a driver circuit (a scanning line driver and data line driver 444) is provided.

Namely, as shown in FIG. 8, the pixel portion 442 on the active matrix substrate 440 comprises a plurality of TFTs (M1) in which gates are connected to scanning lines S1, and ends (terminals) are connected to data lines D1, the other ends being connected to the liquid crystal 460. Similarly, the driver portion 444 also comprises TFT (M2).

FIG. 9 is a sectional view showing a principal portion of the active matrix type liquid crystal display device. As shown in the left side of FIG. 9, the TFT (M1) in the pixel portion 442 comprises source-drain layers 1100a and 1100b, a gate insulation film 1200a, a gate electrode 1300a, an insulation film 1500, and source-drain electrodes 1400a and 1400b. Reference numeral 1700 denotes a pixel electrode comprising an ITO film or a metallic film. With the ITO film, a transmissive liquid crystal panel is formed, and with the metallic film, a reflective liquid crystal panel is formed.

Reference numeral 1702 denotes a region (voltage applied region) where a voltage is applied to the liquid crystal 460 from the pixel electrode 1700.

Also, as shown on the right hand side of FIG. 9, the TFT (M2) which constitutes the driver portion 444 comprises source-drain layers 1100c and 1100d, a gate insulation film 1200b, a gate electrode 1300b, an interlayer insulation film 1500, and source-drain electrodes 1400c and 1400d.

In FIG. 9, reference numeral 480 denotes, for example, an opposite substrate (for example, a soda glass substrate), and reference numeral 482 denotes a common electrode.

Reference numeral 1000 denotes a underlying $SiO_2$ film corresponding to an "intermediate layer". Reference numeral 1600 denotes an insulation film (for example, a CVD $SiO_2$ film), and reference numeral 1800 denotes an adhesive layer. Reference numeral 1900 denotes a substrate (transfer material) comprising, for example, soda glass.

In this embodiment, attention should be given to the point that a recess (through hole) is selectively formed in the insulation film 1600 and the underlying $SiO_2$ film, and the pixel electrode 1700 is bent downward along the surface of the recess and has the exposed back at the bottom thereof to form the voltage applied region 1702 for the liquid crystal 460. This eliminates interposition of the insulation films (the underlying $SiO_2$ film (intermediate layer) 1000 and the interlayer insulation film 1500) between the pixel electrode 1700 and the liquid crystal layer 460, thereby preventing a voltage loss.

If the insulation films remain on the pixel electrode without causing a problem in driving the liquid crystal, the insulation films need not be completely removed. For example, although, in FIG. 9, the underlying $SiO_2$ film (intermediate layer) 1000 is completely removed from the region 1702, the underlying $SiO_2$ film (intermediate layer) 1000 remaining unremoved causes no problem as long as it is thin and causes a little voltage loss.

A detailed description will now be made.

In this embodiment, the active matrix substrate is manufactured by transferring, to a desired transfer material, thin film transistors and pixel electrodes which are formed on the predetermined substrate. In this case, the device transferred onto the transfer material is reverse to a normal device. As a result, in the transferred device, the pixel electrode is covered with an insulator film in the state before transfer such as the interlayer insulation film or the like.

In this state, in assembly of a liquid crystal display device (liquid crystal panel), the insulator layer is interposed between the pixel electrode and the liquid crystal layer, and thus a voltage loss in this portion cannot be neglected.

Therefore, in manufacturing the active matrix substrate, a method is used in which in forming the thin film transistor and the pixel electrode on the original substrate before transfer, at least a portion of the insulator layer such as the interlayer insulation film or the like, which causes a problem in the later steps, is previously removed before the pixel electrode is formed. This causes a portion of the pixel electrode to appear in the surface or the vicinity of the surface by separating the original substrate after the device is transferred to the transfer material. It is thus possible to apply a voltage from this portion. Therefore, the above-described trouble (voltage loss) does not occur.

Even if an unnecessary insulation film remains on the pixel electrode after the thin film transistor is transferred, the remaining insulating film is removed in another step, thereby causing no problem.

FIG. 9 shows a liquid crystal display device manufactured by using the active matrix substrate produced by the above method. [Process for manufacturing liquid crystal display device]

The process for manufacturing the principal portion of the liquid crystal display device shown in FIG. 9 is described below with reference to FIGS. 10 to 14.

First, as shown in FIG. 10, TFT (M1, M2) are formed on a substrate (for example, a quartz substrate) 3000 having high reliability and transmitting laser light through the manufacturing process shown in FIGS. 1 and 2, and an insulation film 1600 is formed. In FIG. 10, reference numeral 3100 denotes a separation layer (laser absorbing layer) comprising, for example, amorphous silicon. Reference numerals 1400a and 1400b denote electrodes (transistor electrodes) made of, for example, aluminum which are connected to $n^+$ layers 1100a and 1100b, respectively, which constitute the TFT of the pixel portion.

In FIG. 10, both TFTs (M1, M2) are N-type MOSFET. However, the TFT is not limited to this, p-type MOSFET and CMOS structures may be used.

Next, as shown in FIG. 11, the insulation film 1600 is selectively etched to form a contact hole (opening) 1620, and the insulation film 1600 and the underlying $SiO_2$ film 1000 are selectively etched to form an opening (through hole) 1610.

These two openings (1610 and 1620) are simultaneously formed in a common etching step. Namely, in forming the contact hole 1620 for connecting the pixel electrode to TFT, the insulation film 1600 and the underlying $SiO_2$ film (intermediate layer) 1000 are also selectively removed. Therefore, the special step for forming the opening 1610 is unnecessary, and an increase in the number of the manufacturing steps can thus be prevented.

Although, in FIG. 11, the insulation 1600 and the underlying $SiO_2$ film (intermediate layer) 1000 are completely removed when the opening 1610 is formed, these films may be left as long as a sufficient voltage can be applied to the liquid crystal. For example, the underlying $SiO_2$ film (intermediate layer) 1000 may be left.

Even when the insulation film 1600 and the underlying $SiO_2$ film (intermediate layer) 1000 are completely removed in formation of the opening 1610, a method may be used in which these films are not removed at a time in this step, but these films are partially left in this step, and the films remaining on the pixel electrode are removed in a later step (for example, the step after the thin film transistor is transferred) to expose the surface of the pixel electrode.

Next, as shown in FIG. 12, the pixel electrode 1700 made of an ITO film is formed.

Next, as shown in FIG. 13, a substrate 1900 (transfer material) is adhered through an adhesive layer 1800. Next, as shown in FIG. 13, the substrate 3000 is irradiated with eximer laser light from the back thereof, and then is exfoliated.

Next, the separation layer (laser absorbing layer) 3100 is removed to complete the active matrix substrate shown in FIG. 14. The bottom (the region 1702) of the pixel electrode 1700 is exposed to permit application of a sufficient voltage to the liquid crystal.

Then an alignment film is formed on the inner sides of the opposite substrate 480 and the active matrix substrate 440 shown in FIG. 14, followed by rubbing. Both substrates are then adhered with a sealing agent with a space formed therebetween, and a liquid crystal is sealed in between the both substrates to complete the liquid crystal display device shown in FIG. 9.

Although the above description is made on the basis of a device structure (the pixel electrode is in an upper layer, and the transistor electrode is in a lower layer) in which the transistors electrode layers 1400a and 1400b connected to the $n^+$ layers 1100a and 1100b, respectively, which constitute the pixel TFT, are in a layer different from the pixel electrode 1700, the device structure is not limited to this. As shown in FIGS. 15 to 17, even when the pixel electrode and the transistor electrode are in the same layer, the above manufacturing method can be applied.

Namely, as shown in FIG. 15, an opening 1612 is formed at the same time that electrode contact holes 1622 and 1630 of the TFT are formed. Therefore, the special step for forming the opening 1612 is unnecessary.

Although, in FIG. 15, the interlayer insulation film 1500 and the underlying $SiO_2$ film (intermediate layer) 1000 are completely removed when the opening 1612 is formed, these films may be left as long as a sufficient voltage can be applied to the liquid crystal. For example, the underlying $SiO_2$ film (intermediate layer) 1000 may be left.

Even when the interlayer insulation film 1500 and the underlying $SiO_2$ film (intermediate layer) 1000 are completely removed in formation of the opening 1612, a method may be used in which these films are not removed at a time in this step, but these films are partially left in this step, and the films remaining on the pixel electrode are removed in a later step (for example, the step after the thin film transistor is transferred) to expose the surface of the pixel electrode.

Next, as shown in FIG. 16, an aluminum electrode 1402 and a pixel electrode (ITO) 1702 are formed.

Then, like in the case shown in FIGS. 13 and 14, the thin film transistor and pixel electrode are adhered to a transfer material 1900 through an adhesive layer 1800, and the substrate 3000 is separated after light irradiation to complete the active matrix substrate shown in FIG. 17.

(Second embodiment)

FIGS. 18 and 19 are sectional views showing a device in accordance with a second embodiment of the present invention.

This embodiment is characterized in that the step of forming a color filter and a light shielding film (for example, a black matrix) is added after the step of forming the pixel electrode made of ITO or a metal to form an active matrix substrate with the color filter and the light shielding film (for example, a black matrix).

The case where the black matrix is used as the light shielding film is described below.

As the structure of an ordinary thin film transistor, a structure in which the color filter and the black matrix are formed on the pixel electrode cannot be used because the liquid crystal layer and the pixel electrode are separated.

However, in the present invention, a device is reverse to a normal device due to transfer, and thus the contact region between the pixel electrode and the liquid crystal layer is formed on the side (i.e., the TFT side) opposite to a conventional device.

Therefore, in the original substrate before transfer, the color filter and the black matrix can be formed without any trouble. In this case, only the common electrode is formed on the opposite substrate, and the color filter and the black matrix, which are conventionally formed on the opposite substrate side, need not be strictly aligned with the pixel electrode, thereby causing the special effect of facilitating assembly of a liquid crystal display device.

As shown in FIG. 18, a color filter 1770 is formed by a pigment dispersion method, a dyeing method or an electrodepositon method to cover the principal portion of the pixel electrode 1700, and a light shielding black matrix 1750 is formed to cover the TFT.

As shown in FIG. 19, the device is adhered to the transfer material 1900 through the adhesive layer 1800, and then the substrate 3000 (FIG. 18) is separated to complete an active matrix substrate with the color filter and the black matrix.

As described above, when a liquid crystal display device is formed by using the active matrix substrate, strict alignment with the opposite substrate is unnecessary, and assembly is facilitated.

(Third embodiment)

FIG. 20 shows a section of the principal portion of a liquid crystal display device in accordance with a third embodiment of the present invention.

The liquid crystal display device shown in FIG. 20 is characterized in that a terminal (external connection terminal) 1404 (made of ITO or a metal) for connecting a driver IC 4200 is formed on the active matrix substrate through the same manufacturing steps as the pixel electrodes.

Namely, in the active matrix substrate, where the external connection terminal (for example, a terminal for connecting liquid crystal driving IC) is required, this terminal must be exposed to the surface.

Therefore, in the region where the external connection terminal is provided, the underlying insulation film (intermediate layer) and the insulator layer such as interlayer insulation film are moved.

However, the surface of the external connection terminal 1404 need not be exposed only in the same step as formation of the opening in the pixel electrode region, and another etching step may be added for removing the film remaining on the surface of the external connection terminal 1404 in the etching step, to expose the surface.

In FIG. 20, "region P1" is a region (bonding pad) to which the lead 4100 of the driver IC 4200 is connected.

Namely, as shown in FIG. 21, the driver IC 4200 is connected to the data line D1 through the pad P1.

In FIG. 20, the driver IC is a tape carrier package (TCP) type IC, and a lead 4100 is connected to the pad P1 (the external connection terminal 1404 ) through an anisotropic conductive film (conductive anisotropic adhesive) 4000, the other lead 4104 being connected to a printed board 4300 through solder 4004.

In FIG. 20, reference numeral 484 denotes the sealing material (sealant), reference numeral 4102 denotes a tape carrier, and reference numeral 4002 denotes a conductive filler. Reference numerals 1010 and 1012 each denote an alignment film. The same portions as FIG. 9 are denoted by the same reference numerals.

The process for manufacturing the active matrix substrate shown in FIG. 20 is described below with reference to FIGS. 22 to 27. Since the manufacturing process is common to that shown in FIGS. 10 to 14, the same portions are denoted by the same reference numerals.

First, as shown in FIG. 22, TFT (M1), the data line D1, and the scanning line S1 (not shown in the drawing) are formed on the substrate 3000. In FIG. 22, the pixel portion is shown on the left side, and the terminal portion where the external connection terminal is formed is shown on the right side.

Next, as shown in FIG. 23, the openings 1610 and 1640 are formed at the same time as the contact holes 1620 and 1630. Therefore, the surface of the separation layer 3100 is exposed at the bottoms of the openings 1610 and 1640. The special step of forming the openings 1610 and 1640 is unnecessary.

Although, in FIG. 23, the insulation film 1600, the interlayer insulation film 1500 and the underlying $SiO_2$ film (intermediate layer) 1000 are completely removed when the opening 1610 is formed, these films may partially be left as long as a sufficient voltage can be applied to the liquid crystal. For example, the underlying $SiO_2$ film (intermediate layer) 1000 may be left. However, in the opening 1640, the insulation film 1600, the interlayer insulation film 1500 and the underlying $SiO_2$ film (intermediate layer) 1000 must be completely removed by etching in the same step or another step.

Even when the insulation film 1600, the interlayer insulation film 1500 and the underlying $SiO_2$ film (intermediate layer) 1000 are completely removed in formation of the opening 1610 (1640), a method may be used in which these films are not removed at a time in this step, but these films are partially left in this step, and the films remaining on the pixel electrode are removed in a later step (for example, the step after the thin film transistor is transferred) to expose the surface of the pixel electrode.

Next, as shown in FIG. 24, the pixel electrode made of ITO and the external connection terminal 1404 made of ITO are simultaneously formed.

Next, as shown in FIG. 25, a device is adhered to the transfer material 1900 through the adhesive layer 1800.

Next, as shown in FIG. 26, the substrate 3000 side is irradiated with laser light to generate ablation in the separation layer 3100.

Next, the substrate 3000 is separated, and the separation layer 3100 is completely removed to form the active matrix substrate shown in FIG. 27. In FIG. 27, reference numeral 1710 denotes a voltage applied region for the liquid crystal, and region P1 corresponds to a pad for connecting the region P1 and the driver IC.

Although the above description is made on the basis of a device structure (the pixel electrode and the external connection terminal are in an upper layer, and the transistor electrodes are in a lower layer) in which the transistor electrode layers 1400a and 1400b connected to the $n^+$ layers 1100a and 1100b, respectively, which constitute the TFT of the pixel, are in a layer different from the pixel electrode 1700 and the external connection terminal 1404, the device structure is not limited to this. As shown in FIGS. 28 to 30, even when the pixel electrode, the external connection terminal and the transistor electrode are in the same layer, the above manufacturing method can be applied.

Namely, as shown in FIG. 28, openings 1612 and 1642 are formed at the same time as electrode contact holes 1622 and 1630 of the TFT. Therefore, the special step for forming the openings 1612 and 1642 is unnecessary.

Next, as shown in FIG. 29, an aluminum electrode 1402, the data line D1 (and the scanning line not shown in the drawing) made of aluminum, a pixel electrode (ITO) 1702 made of ITO and an external connection terminal 1406 made of ITO are formed.

Then, the device is adhered to the transfer material 1900 through the adhesive layer 1800, and the substrate is separated after light irradiation to complete the active matrix substrate shown in FIG. 30.

The pixel electrode and the external connection terminal need not be made of ITO, and may be a metal electrode made of aluminum which serve as a reflection type pixel electrode. When the pixel electrode is a metal electrode, there is the advantage of low wiring resistance. In this case, the external connection terminal is made of the same metal material, thereby causing an advantage from the viewpoint of electrical properties.

(Fourth embodiment)

FIGS. 31 to 38 shows the sectional structure of a device in accordance with a fourth embodiment of the present invention.

Although, in the above embodiments, the insulator layer below the pixel electrode is previously removed before transfer of the device, in this embodiment, at least a portion of the insulator layer below the pixel electrode is removed in self alignment by using a black matrix after transfer.

Namely, the black matrix is formed on the original substrate before transfer, and exposure is performed by using the black matrix as an exposure mask after transfer by utilizing the fact that the black matrix is formed around the pixel electrode, followed by development to form a desired resist pattern. The insulator layer below the pixel electrode is removed by using the resist pattern as an etching mask.

A detailed description will now be made.

First, as shown in FIG. 31, like in FIG. 10, TFT (M1) is formed, the insulation film 1600 is then formed to cover the TFT (M1), a contact hole is formed in the insulation film 1600, and then a pixel electrode (an ITO film or metal film) 1790 is formed. In this embodiment, attention should be given to the point that unlike FIGS. 11 and 15, no additional opening is formed in the insulation film 1600.

Next, a black matrix 1750 is formed. The black matrix 1750 is provided to shield the periphery of the principal portion (the voltage applied region for the liquid crystal) from light except the principal portion, as shown on the lower side of FIG. 34.

Next, as shown in FIG. 32, a device is adhered to the transfer material 1900 through the adhesive layer 1800, and the substrate 3000 side is irradiated with laser light.

Next, as shown in FIG. 33, the substrate 3000 is separated, and the remaining separation layer 3100 is also removed.

Next, as shown in FIG. 34, a photoresist 5000 is formed on the surface obtained by separating the substrate 3000, followed by exposure from the transfer material 1900 side. In this case, the black matrix 1750 serves as an exposure mask to automatically irradiate only the region of contact between the pixel electrode and the liquid crystal with light.

Next, as shown in FIG. 35, the photoresist 5000 is patterned by development.

Next, as shown in FIG. 36, the underlying insulation film (intermediate layer) 1000, the gate insulation film 1500, the insulation film 1600 are etched by using the patterned photoresist 5000 as a mask to form an opening 8002. As a result, the surface of the pixel electrode is exposed.

Like in the above embodiments, the films may be left on the pixel electrode as long as no trouble occurs in driving the liquid crystal. Alternatively, the remaining films may be removed in another step to expose the surface of the pixel electrode.

Next, as shown in FIG. 37, the photoresist 5000 is removed to complete an active matrix substrate.

The liquid crystal display device shown in FIG. 38 is manufactured by using the active matrix substrate. In FIG. 38, the same portions as FIG. 9 are denoted by the same reference numerals.

Although, in this embodiment, only the black matrix is formed, the color filter may be formed on the active matrix substrate as long as the exposure conditions for photoresist are satisfied, as in the case shown in FIGS. 18 and 19.

Like in the above embodiments, not only the pixel electrode but also the external connection terminal can be formed by the same method as described above.

(Fifth embodiment)

FIGS. 39 to 42 show the sectional structure of a device in accordance with a fifth embodiment of the present invention.

In this embodiment, when a thin film transistor is formed on an original substrate before transfer, a pixel electrode is previously formed. Therefore, the original substrate before transfer is separated after transfer of the device to automatically expose the surface of the pixel electrode.

Namely, as shown in FIG. 39, an aluminum electrode 7100 and a pixel electrode 7000 made of ITO are formed on a separation layer 3100. The pixel electrode 7000 may be made of a metal such as aluminum or the like. In this case, the pixel electrode 7000 can be formed at the same time as the aluminum electrode 7100.

Next, as shown in FIG. 40, an interlayer insulation film 7200, source-drain layers 7300a and 7300b, a gate insulation film 7400, and a gate electrode 7500 are formed, and the device is then adhered to a transfer material 7700 through an adhesive layer 7600. Next, the substrate 3000 side is irradiated with laser light.

Next, as shown in FIG. 41, the substrate 3000 is separated, and the remaining separation layer 3100 is removed to complete an active matrix substrate.

The liquid crystal display device shown in FIG. 42 is manufactured by using the active matrix substrate. In FIG. 42, the same portions as FIG. 9 are denoted by the same reference numerals.

In FIG. 42, reference numeral 4100 denotes a lead of a driver IC; reference numeral 4102, a tape carrier; reference numeral 4000, a conductive anisotropic adhesive; and reference numeral 4002, a conductive filler.

As described above, the present invention is capable of effectively removing the problems due to reversal of a device which results from the use of the transfer technique. Therefore, a substrate used in manufacturing thin film devices and a substrate (for example, a substrate having preferable properties from the viewpoint of application of a product) used in, for example, actual use of a product can be freely individually selected. For example, an active matrix substrate can be formed by using a flexible plastic substrate.

The active matrix substrate can be used for not only a liquid crystal display device but for also other applications. For example, an active matrix substrate on which an electronic circuit (a computer or the like) comprising TFTs is mounted can be formed.

The present invention is not limited to the above embodiments, and various modifications can be made. For example, although, in each of the above embodiments, a type (top gate type) in which a gate electrode is disposed above a channel after the channel is formed is described as an example of thin film transistor (TFT) structures, TFT structures of a type (bottom gate type) in which the gate electrode is formed before the channel is formed can also be used.

Further, although, in the embodiments, the manufacturing substrate is separated from the separation layer by irradiation with laser light or the like, of course, the present invention can be applied to any cases using other methods of separating the substrate as long as the methods can separate the manufacturing substrate from the separation layer.

Industrial Applicability

As described above, the present invention is capable of forming a liquid crystal display device by forming the thin film transistors on the substrate and then transferring thin film transistors to any one of various other substrates, thus providing as an active type liquid crystal display device a liquid crystal display device using glass, plastic, films or the like, which cannot be used for conventional active type liquid crystal display devices.

What is claimed is:

[1. A method of manufacturing an active matrix substrate comprising a pixel portion including thin film transistors connected to scanning lines and signal lines arranged in a matrix, and pixel electrodes connected to terminals of the thin film transistors, the method comprising the steps of:

forming a separation layer on a substrate;

forming the thin film transistors over the separation layer;

forming an insulation film on the thin film transistors and over the separation layer;

selectively removing at least a portion of the insulation film where each of the pixel electrodes is to be formed;

forming each of the pixel electrodes on the insulation film and the separation layer in the region where at least a portion of the insulation film has been removed;

adhering the thin film transistors to a transfer material with an adhesive layer;

producing exfoliation in the separation layer and/or at an interface of the separation layer and the substrate to separate the substrate from the separation layer; and removing any portion of the separation layer remaining on the pixel electrodes to form an active matrix substrate using the transfer material as a new substrate.]

[2. The method of manufacturing an active matrix substrate according to claim 1, wherein the step of selectively removing at least a portion of the insulation film comprises forming contact holes for electrically connecting the pixel electrodes to the thin film transistors.]

[3. The method of manufacturing an active matrix substrate according to claim 2, further comprising connecting the pixel electrodes directly to an impurity layer which constitutes the thin film transistors.]

[4. The method of manufacturing an active matrix substrate according to claim 2, further comprising the steps of:

forming electrodes connected to an impurity layer which constitutes the thin film transistors; and connecting the pixel electrodes to the corresponding electrodes connected to the impurity layers.]

[5. The method of manufacturing an active matrix substrate according to claim 1, further comprising the step of forming at least one of a color filter and a light shielding film after the step of forming the pixel electrodes.]

[6. The method of manufacturing an active matrix substrate according to claim 1, wherein in selectively removing at least a portion of the insulation film, at least a portion of the insulation film is selectively removed from a region where an external connection terminal is to be provided.]

[7. The method of manufacturing an active matrix substrate according to claim 6, further comprising the step of forming the external connection terminal as a conductive layer made of a same material as the pixel electrodes or a same material as an electrode connected to an impurity layer which constitutes the thin film transistors.]

[8. A method of manufacturing an active matrix substrate comprising a pixel portion including thin film transistors connected to scanning lines and signal lines arranged in a matrix, and pixel electrodes connected to terminals of the thin film transistors, the method comprising the steps of:

forming a separation layer on a substrate;

forming an intermediate layer on the separation layer;

forming the thin film transistors on the intermediate layer;

forming an insulation film on the thin film transistors and the intermediate layer;

selectively removing at least a portion of the insulation film where each of the pixel electrodes is to be formed;

forming each of the pixel electrodes on the insulation film and the separation layer in the region where at least a portion of the insulation film is removed;

adhering the thin film transistors to a transfer material with an adhesive layer;

producing exfoliation in the separation layer and/or at an interface of the separation layer and the substrate to separate the substrate from the separation layer; and removing any portion of the separation layer remaining on the intermediate layer and the pixel electrodes to form an active matrix substrate using the transfer material as a new substrate.]

[9. The method of manufacturing an active matrix substrate according to claim 8, wherein the step of selectively removing at least a portion of the insulation film comprises forming contact holes for electrically connecting the pixel electrodes to the thin film transistors.]

[10. The method of manufacturing an active matrix substrate according to claim 9, further comprising connecting the pixel electrodes directly to an impurity layer which constitutes the thin film transistors.]

[11. The method of manufacturing an active matrix substrate according to claim 9, further comprising the steps of:

forming electrodes connected to an impurity layer which constitutes the thin film transistors; and connecting the pixel electrodes to the corresponding electrodes connected to the impurity layers.]

[12. The method of manufacturing an active matrix substrate according to claim 8, further comprising the step of forming at least one of a color filter and a light shielding film after the step of forming the pixel electrodes.]

[13. The method of manufacturing an active matrix substrate according to claim 8, wherein in selectively removing at least a portion of the insulation film, at least a portion of the insulation film is selectively removed from a region where an external connection terminal is to be provided.]

[14. The method of manufacturing an active matrix substrate according to claim 13, further comprising the step of forming the external connection terminal as a conductive layer made of a same material as the pixel electrodes or a same material as an electrode connected to an impurity layer which constitutes the thin film transistors.]

[15. A method of manufacturing an active matrix substrate comprising a pixel portion including thin film transistors connected to scanning lines and signal lines arranged in a matrix, and pixel electrodes connected to terminals of the thin film transistors, the method comprising the steps of:

forming a separation layer on a transmissive substrate;

forming the thin film transistors over the separation layer or on an intermediate layer formed on the separation layer;

forming an insulation film on the thin film transistors;

forming the pixel electrodes made of a conductive material on the insulation film;

forming a light shielding layer that is overlapped with the thin film transistors, and not overlapped with at least a portion of the pixel electrodes;

adhering the thin film transistors and the light shielding layer to a transmissive transfer material with a transmissive adhesive layer;

irradiating the separation layer through the transmissive substrate to produce exfoliation in the separation layer and/or at an interface of the separation layer and the transmissive substrate to separate the transmissive substrate from the separation layer;

forming a photoresist on a surface obtained by separating the transmissive substrate or the surface of a layer appearing after removing any remaining portion of the separation layer;

irradiating light to expose only a predetermined portion of the photoresist using the light shielding layer as a mask, followed by development to form a desired photoresist mask;

selectively removing at least a portion of the intermediate layer and the insulation film or at least a portion of the insulation film by using the photoresist mask; and removing the photoresist mask to form an active matrix substrate using the transfer material as a new substrate.]

[16. A method of manufacturing an active matrix substrate comprising a pixel portion including thin film transistors connected to scanning lines and signal lines arranged in a matrix, and pixel electrodes connected to terminals of the thin film transistors, the method comprising the steps of:

forming a separation layer on a substrate;

forming the pixel electrodes over the separation layer or on an intermediate layer formed on the separation layer;

forming an insulation film on the pixel electrodes, and forming the thin film transistors on the insulation film to respectively connect the thin film transistors to the pixel electrodes;

adhering the thin film transistors to a transmissive transfer material with a transmissive adhesive layer;

producing exfoliation in the separation layer and/or at an interface of the separation layer and the substrate to separate the substrate from the separation layer; and removing any portion of the separation layer remaining on the intermediate layer to form an active matrix substrate using the transfer material as a new substrate.]

[17. The method of manufacturing an active matrix substrate according to claim 16, further comprising forming a conductive material layer on the separation layer or on the intermediate layer at a position where an external connection terminal is to be formed.]

[18. An active matrix substrate manufactured by the method of manufacturing an active matrix substrate according to claim 1.]

[19. An active matrix substrate manufactured by the method of manufacturing an active matrix substrate according to claim 8.]

[20. An active matrix substrate manufactured by the method of manufacturing an active matrix substrate according to claim 15.]

[21. An active matrix substrate manufactured by the method of manufacturing an active matrix substrate according to claim 16.]

[22. A liquid crystal display device comprising an active matrix substrate manufactured by the method of manufacturing an active matrix substrate according to claim 1.]

[23. A liquid crystal display device comprising an active matrix substrate manufactured by the method of manufacturing an active matrix substrate according to claim 8.]

[24. A liquid crystal display device comprising an active matrix substrate manufactured by the method of manufacturing an active matrix substrate according to claim 15.]

[25. A liquid crystal display device comprising an active matrix substrate manufactured by the method of manufacturing an active matrix substrate according to claim 16.]

*26. A device comprising:*

*a substrate;*

*an adherent layer formed over the substrate;*

*a thin film device being attached to the substrate by the adherent layer;*

*at least one of an insulation film, which is positioned over the thin film device with respect to the adherent layer, and an intermediate layer, which is positioned between the thin film device and the adherent layer, the one of the insulation film and the intermediate layer having an opening where no thin film device is formed; and*

*a pixel electrode connected with the thin film device, the pixel electrode being positioned over the adherent layer and substantially exposed through the opening.*

*27. A device according to claim 26, wherein a contact hole is provided in the intermediate layer and the pixel electrode is connected with the thin film device through the contact hole.*

*28. A device according to claim 26, further comprising an other electrode exposed through an other opening in the at least one of the insulating film and the intermediate layer, the other electrode including an external connection terminal that connects with an external circuit.*

*29. A device according to claim 26, wherein the thin film device is selected from the group including a thin film transistor (TFT), a thin film diode, an electrode, a switching device, a memory, an actuator, magnetic recording thin film head, a coil, an inductor, a filter, a reflector, dichroic mirror and combination thereof.*

*30. A device according to claim 26, further comprising a light shielding layer being positioned over the thin film device.*

*31. The device according to claim 28, the other electrode being electrically connected to the same thin film device as the pixel electrode.*

*32. The device according to claim 28, the pixel electrode being formed from a substantially transparent electrically conductive material.*

*33. The device according to claim 26, further comprising an alignment layer formed over the pixel electrode.*

* * * * *